United States Patent
Kim et al.

(10) Patent No.: US 11,788,005 B2
(45) Date of Patent: *Oct. 17, 2023

(54) QUANTUM DOTS, A COMPOSITION OR COMPOSITE INCLUDING THE SAME, AND AN ELECTRONIC DEVICE INCLUDING THE SAME

(71) Applicant: SAMSUNG ELECTRONICS CO., LTD., Suwon-si (KR)

(72) Inventors: Tae Gon Kim, Hwaseong-si (KR); Shin Ae Jun, Seongnam-si (KR); Taek hoon Kim, Hwaseong-si (KR); Hyeyeon Yang, Suwon-si (KR); Nayoun Won, Suwon-si (KR); Jongmin Lee, Hwaseong-si (KR); Mi Hye Lim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/824,225

(22) Filed: May 25, 2022

(65) Prior Publication Data
US 2022/0298413 A1    Sep. 22, 2022

Related U.S. Application Data

(63) Continuation of application No. 16/904,664, filed on Jun. 18, 2020, now Pat. No. 11,352,558.

(30) Foreign Application Priority Data

Jun. 18, 2019   (KR) .......... 10-2019-0072494

(51) Int. Cl.
   *C09K 11/70*   (2006.01)
   *C08F 220/38*  (2006.01)
   (Continued)

(52) U.S. Cl.
   CPC .......... *C09K 11/70* (2013.01); *C08F 220/382* (2020.02); *C09K 11/025* (2013.01);
   (Continued)

(58) Field of Classification Search
   CPC .............................. C09K 11/883; C09K 11/70
   See application file for complete search history.

(56) References Cited

U.S. PATENT DOCUMENTS 7,476,487 B2   1/2009   Park et al.
7,746,423 B2   6/2010   Im et al.
(Continued)

FOREIGN PATENT DOCUMENTS

CN   106987250 A   7/2017
EP   3184603 A1    6/2017
(Continued)

OTHER PUBLICATIONS

Christian Ippen, et al., InP/ZnSe/ZnS: A Novel Multishell System for InP Quantum Dots for Improved Luminescence Efficiency and Its application in a Light-Emitting Device, Journal of Information Display, 2012, 13, 91-95.
(Continued)

*Primary Examiner* — C Melissa Koslow
(74) *Attorney, Agent, or Firm* — CANTOR COLBURN LLP

(57) ABSTRACT

Quantum dots and a composite and a display device including the quantum dots. The quantum dots comprise a semiconductor nanocrystal core comprising indium and phosphorous, and optionally zinc, a semiconductor nanocrystal shell disposed on the semiconductor nanocrystal core, the first semiconductor nanocrystal shell comprising zinc, selenium, and sulfur, wherein the quantum dots are configured to exhibit a maximum photoluminescence peak in a green light wavelength region, and in an ultraviolet-visible (UV-
(Continued)

Vis) absorption spectrum of the quantum dots, a ratio $A_{450}/A_{first}$ of an absorption value at 450 nm to an absorption value at a first excitation peak is greater than or equal to about 0.7, and a valley depth (VD) defined by the following equation is greater than or equal to about 0.4:

$$(Abs_{first}-Abs_{valley})/Abs_{first}=VD$$

wherein, $Abs_{first}$ is an absorption value at the first absorption peak wavelength and $Abs_{valley}$ is an absorption value at a lowest point of the valley adjacent to the first absorption peak, and wherein the maximum photoluminescence peak of the quantum dots has a full width at half maximum of less than or equal to 40 nanometers.

21 Claims, 6 Drawing Sheets

(51) Int. Cl.

| | | |
|---|---|---|
| C09K 11/02 | (2006.01) | |
| C09K 11/88 | (2006.01) | |
| H01L 33/00 | (2010.01) | |
| H01L 33/50 | (2010.01) | |
| B82Y 20/00 | (2011.01) | |

(52) U.S. Cl.
CPC ............ *C09K 11/88* (2013.01); *C09K 11/883* (2013.01); *H01L 33/005* (2013.01); *H01L 33/502* (2013.01); *B82Y 20/00* (2013.01); *H01L 2933/0025* (2013.01); *H01L 2933/0041* (2013.01)

(56) References Cited

U.S. PATENT DOCUMENTS

| | | | |
|---|---|---|---|
| 9,196,682 | B2 | 11/2015 | Jang et al. |
| 9,631,141 | B2 | 4/2017 | Guo et al. |
| 10,126,587 | B2 | 11/2018 | Chung |
| 10,246,634 | B2 | 4/2019 | Yang et al. |
| 10,364,391 | B2 | 7/2019 | Jang et al. |
| 10,450,507 | B2 | 10/2019 | Jang et al. |
| 10,520,765 | B2 | 12/2019 | Chung |
| 10,533,127 | B2 | 1/2020 | Park et al. |
| 11,352,558 | B2 * | 6/2022 | Kim ................... G03F 7/0007 |
| 2017/0052444 | A1 | 2/2017 | Park et al. |
| 2017/0059988 | A1 | 3/2017 | Paek et al. |
| 2017/0179338 | A1 | 6/2017 | Park et al. |
| 2017/0183565 | A1 | 6/2017 | Jun et al. |
| 2017/0306227 | A1 | 10/2017 | Ippen et al. |
| 2018/0105739 | A1 | 4/2018 | Kim et al. |
| 2018/0119007 | A1 | 5/2018 | Ippen et al. |
| 2018/0142149 | A1 | 5/2018 | Youn et al. |
| 2018/0186998 | A1 | 7/2018 | Ahn et al. |
| 2018/0239245 | A1 | 8/2018 | Yang et al. |
| 2019/0006556 | A1 | 1/2019 | Park et al. |
| 2019/0051484 | A1 | 2/2019 | Nakamura et al. |
| 2019/0211260 | A1 | 7/2019 | Won et al. |
| 2019/0221260 | A1 * | 7/2019 | Wang ................... G11C 13/003 |
| 2020/0220043 | A1 | 7/2020 | Park et al. |

FOREIGN PATENT DOCUMENTS

| | | |
|---|---|---|
| KR | 10-20160020912 A | 2/2016 |
| KR | 10-20171858086 | 9/2017 |
| KR | 10-20180081002 A | 7/2018 |

OTHER PUBLICATIONS

Eunbyul Bang, et al., Large-Scale Synthesis of Highly Luminescent InP@ZnS Quantum Dots Using Elemental Phosphorus Precursor, Chem. Mater. 2017, 29, 4236-4243.

Extended European Search Report dated Nov. 17, 2020, of the corresponding European Patent Application No. 20180699.9.

Francesca Pietra, et al., Tuning the Lattice Parameter of InxZnyP for Highly Luminescent Lattice-Matched Core/Shell Quantum Dots., ACS Nano. Apr. 26, 2016;10(4):4754-62.

Haitao Liu, et al., Mechanistic Study of Precursor Evolution in Colloidal Group II-VI Semiconductor Nanocrystal Synthesis, J. Am. Chem. Soc., 2007, 129 (2), pp. 305-312.

Kyungnam Kim, et al., Appl. Phys. Lett. 101, 073107 (2012); doi: 10.1063/1.4745844, Highly luminescing multi-shell semiconductor nanocrystals InP/ZnSe/ZnS.

Kyungnam Kim,, et al., J. Mater. Chem, Design and synthesis of photostable multi-shell Cd-free nanocrystal quantum dots for LED applications, 2012, 22, 21370.

Lin Song Li, et al., High Quality ZnSe and ZnS Nanocrystals Formed by Activating Zinc Carboxylate Precursors, Nano Letters, 2004, 4 (11), pp. 2261-2264.

Parthiban Ramasamy, et al., Tunable, Bright, and Narrow-Band Luminescence from ColloidalIndium Phosphide Quantum Dots, Chem. Mater. 2017, 29, 6893-6899.

Parthiban Ramasamy, et al., Two-Step "Seed-Mediated" Synthetic Approach to Colloidal Indium Phosphide Quantum Dots with High-Purity Photo- and Electroluminescence, Chem Mater., 2018, 30 (11), pp. 3643-3647.

* cited by examiner

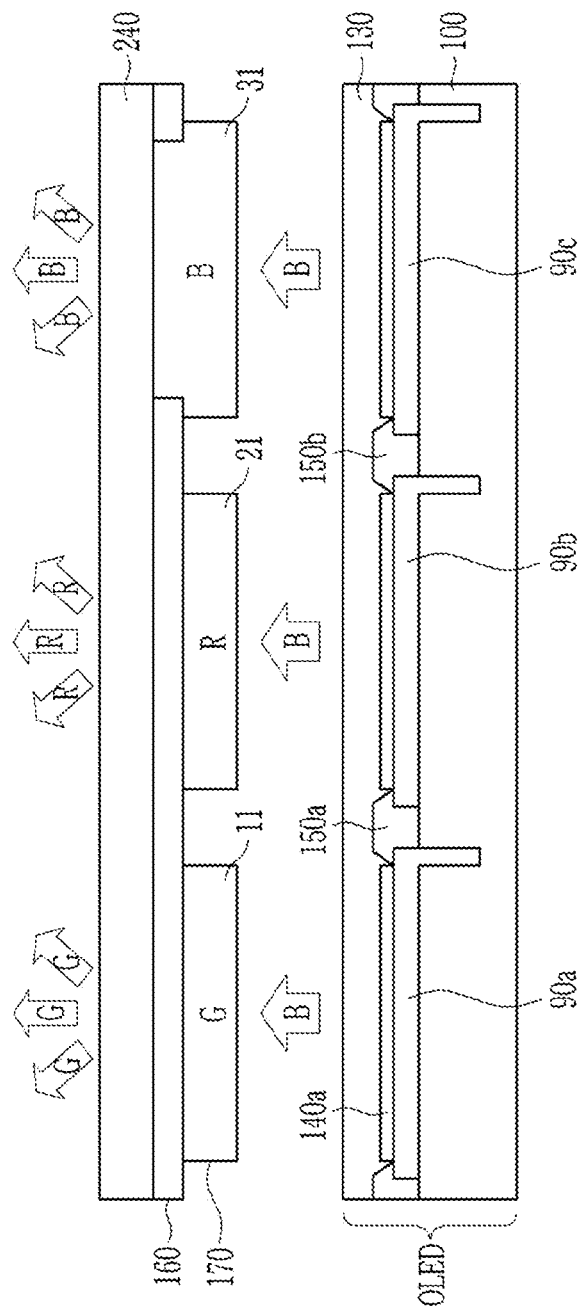

Pattern Preparation by using a photoresist

Repeating the Patterning Process three times

QUANTUM DOTS, A COMPOSITION OR COMPOSITE INCLUDING THE SAME, AND AN ELECTRONIC DEVICE INCLUDING THE SAME

CROSS-REFERENCE TO RELATED APPLICATION

This application is a continuation application of U.S. application Ser. No. 16/904,664 filed Jun. 21, 2020, now U.S. Pat. No. 11,352,558, which in turn claims priority to Korean Patent Application No. 10-2019-0072494, filed in the Korean Intellectual Property Office on Jun. 18, 2019, and all the benefits accruing therefrom under 35 U.S.C. §§ 119, 120, the contents of which in their entirety is herein incorporated by reference.

BACKGROUND

1. Field

Quantum dots, a composition or composite including the quantum dots, and an electronic device (e.g., a display device) including the quantum dots, or the composite including the quantum dots, are disclosed.

2. Description of the Related Art

Unlike a bulk material, a quantum dot (e.g., nano-sized semiconductor nanocrystal) has an energy bandgap that can be controlled by adjusting the size or composition of the quantum dot. A quantum dot may exhibit electroluminescent and photoluminescent properties. A quantum dot may be prepared by a colloidal synthesis, and organic materials such as a dispersing agent may coordinate, e.g., be bound, to a surface of the semiconductor nanocrystal during the crystal growth to provide a quantum dot having a controlled size and having desired luminescent properties. Lastly, the development of a cadmium free quantum dot with improved luminescent properties is desirable from an environmental perspective.

SUMMARY

An embodiment provides an environmentally friendly quantum dot that is substantially free of cadmium, and may exhibit improved photoluminescence properties and enhanced stability, e.g., thermal stability.

An embodiment provides a method of producing the aforementioned quantum dot.

An embodiment provides a composition including the aforementioned quantum dot.

An embodiment provides a quantum dot polymer composite including the aforementioned quantum dot.

An embodiment provides an electronic device including the aforementioned quantum dot.

An embodiment provides a layered structure and an electronic device including the layered structure, the layered structure including the aforementioned quantum dot polymer composite in at least one layer.

In an embodiment, a quantum dot includes a semiconductor nanocrystal core including indium (In) and phosphorous (P), a semiconductor nanocrystal shell disposed on the semiconductor nanocrystal core, the semiconductor nanocrystal shell including zinc, selenium, and sulfur, wherein the quantum dot has a maximum photoluminescence peak in a green light wavelength region, and in an ultraviolet-visible (UV-Vis) absorption spectrum of the quantum dot, a ratio of $A_{450}/A_{first}$, (i.e., a ratio of an absorption value at 450 nanometers (nm) with respect to an absorption value of a first absorption peak) is greater than or equal to about 0.7, and a valley depth (VD) defined by the following equation is greater than or equal to about 0.4:

$$1-(Abs_{valley}/Abs_{first})=VD$$

wherein, $Abs_{first}$ is the absorption value of the first absorption peak wavelength, and $Abs_{valley}$ is an absorption value at a lowest point of the valley adjacent to the first absorption peak, and wherein the quantum dot does not include cadmium.

The semiconductor nanocrystal core may further include zinc.

In the quantum dot, a mole ratio of sulfur with respect to selenium (S/Se) may be less than or equal to about 2.5:1.

In the quantum dot, a mole ratio of sulfur with respect to selenium (S/Se) may be less than or equal to about 1:1.

In the quantum dot, a mole ratio of sulfur with respect to selenium (S/Se) may be less than or equal to about 0.8:1.

In the quantum dot, a mole ratio of zinc with respect to indium (Zn/In) may be greater than or equal to about 10:1.

In the quantum dot, a mole ratio of zinc with respect to indium (Zn/In) may be less than or equal to about 50:1, less than or equal to about 49:1, less than or equal to about 48:1, less than or equal to about 47:1, or less than or equal to about 46:1.

In the quantum dot, a mole ratio of zinc with respect to indium is greater than or equal to about 26:1 and less than or equal to about 45:1.

In the quantum dot, a mole ratio of a sum of selenium and sulfur with respect to indium (S+Se)/In may be greater than or equal to about 10.

In the quantum dot, a mole ratio of a sum of selenium and sulfur with respect to indium (S+Se)/In may be less than or equal to about 40.

The semiconductor nanocrystal shell may include a first shell layer including zinc and selenium, and a second shell layer disposed on the first layer and including zinc and sulfur. The first shell layer may be positioned between the nanocrystal core and the second shell layer.

The first shell layer may be disposed directly on the semiconductor nanocrystal core. The first shell layer may not include sulfur.

The second shell layer may not include selenium.

The second shell layer may be an outermost layer of the quantum dot (or the semiconductor nanocrystal shell).

The green light wavelength region may be greater than or equal to about 500 nm.

The green light wavelength region may less than or equal to about 560 nm.

A wavelength of the maximum photoluminescent peak may be greater than or equal to about 525 nm and less than or equal to about 540 nm. The first absorption peak may be in a wavelength range of greater than about 450 nm and less than or equal to about the wavelength of the maximum photoluminescent peak.

The first absorption peak may be in a wavelength range of greater than or equal to about 455 nm.

The valley adjacent to the first absorption peak may be present in a wavelength range of greater than or equal to about 420 nm, greater than or equal to about 425 nm, greater than or equal to about 430 nm, greater than or equal to about 440 nm, greater than or equal to about 450 nm, or greater than or equal to about 460 nm.

The valley (or a lowest point of the valley) may be present in a range of less than or equal to about the wavelength of the first absorption peak.

The valley adjacent to the first absorption peak may be present in a wavelength range of less than or equal to about 490 nm, less than or equal to about 485 nm, less than or equal to about 480 nm, less than or equal to about 475 nm, or less than or equal to about 470 nm.

The valley adjacent to the first absorption peak is present in a range of greater than or equal to about 420 nanometers and less than or equal to about 490 nanometers.

In the ultraviolet-visible (UV-Vis) absorption spectrum of the quantum dot, a ratio of an absorption value at 450 nm with respect to an absorption value at a first absorption peak may be greater than or equal to about 0.75.

The valley depth (VD) may be greater than or equal to about 0.5.

The valley depth (VD) may be greater than or equal to about 0.52.

The quantum dot may constitute a population of quantum dots, i.e., present as a plurality of quantum dots, having an average size of greater than or equal to about 4 nm and less than or equal to about 8 nm and a standard deviation of less than or equal to about 30% of the average size.

The quantum dot may have a maximum photoluminescence peak with a full width at half maximum of less than or equal to about 50 nm, for example, less than or equal to about 45 nm, or less than or equal to about 40 nm.

A quantum efficiency (quantum yield) of the quantum dot may be greater than or equal to about 80%, or greater than or equal to about 84%.

In an embodiment, a composition includes (e.g., a plurality of) the aforementioned quantum dot, a dispersing agent, and an organic solvent. The dispersing agent may include a carboxylic acid group containing binder polymer. The composition may further include a photopolymerizable monomer including a carbon-carbon double bond and optionally a (thermal or photo) polymerization initiator.

In an embodiment, a quantum dot-polymer composite includes a polymer matrix and (e.g., a plurality of) the aforementioned quantum dot dispersed in the polymer matrix.

The polymer matrix may include a linear polymer, a crosslinked polymer, or a combination thereof.

The polymer matrix may include a carboxylic acid group containing binder polymer.

The carboxylic acid group containing binder polymer may include:

a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer including a backbone structure in which two aromatic rings are bound to a quaternary carbon atom that is a constituent atom of another cyclic moiety in a main chain of the backbone structure, the multiple aromatic ring-containing polymer including a carboxylic acid group (—COOH);

or a combination of the copolymer and multiple aromatic ring-containing polymer.

The polymer matrix may comprise a crosslinked polymer, a linear polymer having a carboxylic acid group, or a combination thereof.

The polymer matrix may include a crosslinked polymer, and the crosslinked polymer includes a polymerization product of a monomer having at least two carbon-carbon double bond, a polymerization product of the monomer and a poly thiol compound including at least two thiol groups, or a combination thereof. The polymer matrix may include metal oxide fine particles dispersed in the polymer matrix.

The polymer matrix may further include a polymerization product of a monomer combination including a carbon-carbon double bond and a mono- or poly-thiol compound including at least one (or at least two) thiol group(s) (e.g., at a terminal end of the thiol compound), a metal oxide fine particle, or a combination thereof.

The quantum dot-polymer composite may be in a form of a patterned film.

In an embodiment, a display device includes a light source and a light emitting element, wherein the light emitting element includes the aforementioned quantum dot-polymer composite and the light source provides the light emitting element with incident light.

The display device may exhibit color reproducibility of greater than or equal to about 80% based on BT2020. The incident light may have a luminescence peak wavelength of about 440 nanometers to about 460 nanometers.

In an embodiment, the light emitting element may include a sheet including the quantum dot-polymer composite.

In an embodiment, the light emitting element may include a stacked structure including a substrate and a light emitting layer disposed on the substrate, wherein the light emitting layer includes a pattern including the quantum dot-polymer composite.

The quantum dot-polymer composite pattern may include at least one repeating section configured to emit light at a predetermined wavelength.

The quantum dot-polymer composite pattern may include a first section configured to emit a first light.

The quantum dot-polymer composite pattern may further include a second section configured to emit a second light having a center wavelength that is different from a center wavelength of the first light.

The quantum dot-polymer composite may include a blue light conversion rate of greater than or equal to about 29% after being thermally-treated at a temperature of about 180° C. for 30 minutes.

Quantum dots of an embodiment may exhibit improved luminous properties together with enhanced (process) stability. A composition including the aforementioned quantum dots may provide improved processability. The quantum dots may find uses in various display devices and biological labelling (e.g., bio sensor, bio imaging, etc.), a photo detector, a solar cell, a hybrid composite, or the like.

The quantum dots of an embodiment may exhibit enhanced blue light absorption, which may find their potential uses in a quantum dot based photoluminescent color filter. The photoluminescent color filter may be used in a display device that includes various blue light sources (e.g., a blue light emitting OLED, a micro LED emitting blue light) and a liquid crystal display device including a blue light source.

BRIEF DESCRIPTION OF THE DRAWINGS

These and/or other aspects will become apparent and more readily appreciated from the following description of the embodiments, taken in conjunction with the accompanying drawings in which:

FIG. 3A is a cross-sectional view of a device according to an embodiment;

DETAILED DESCRIPTION

Figure 1:
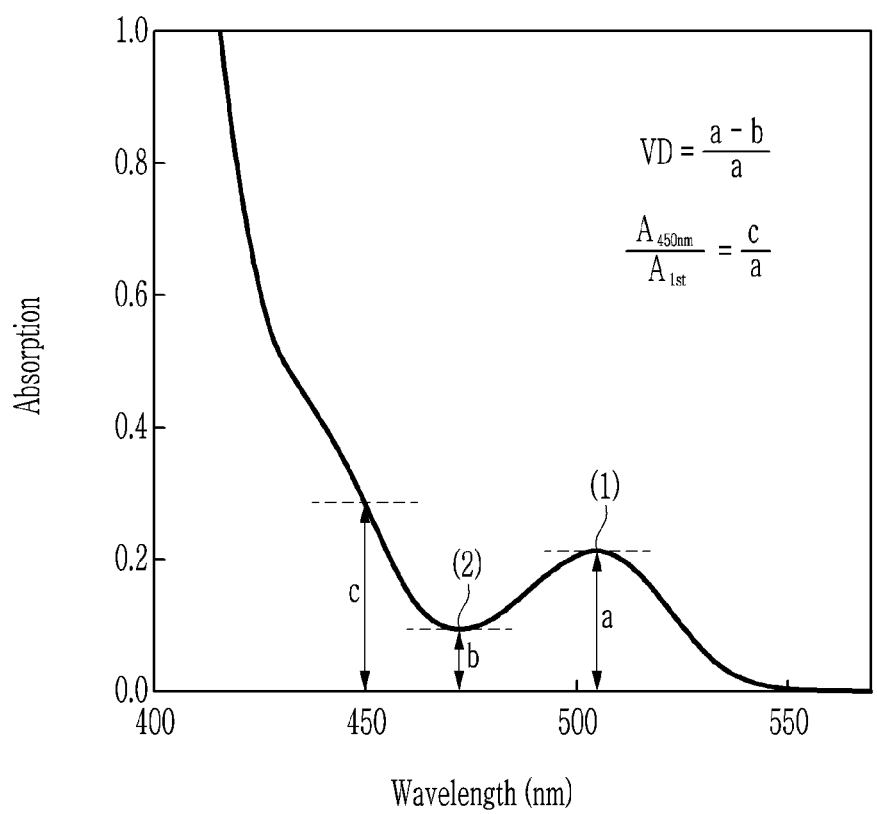
FIG. 1 is a view illustrating a valley depth and a ratio of an absorption intensity of a UV-Vis absorption spectrum of a quantum dot according to an embodiment.

Advantages and characteristics of this disclosure, and a method for achieving the same, will become evident referring to the following example embodiments together with the accompanying drawings. However, the embodiments should not be construed as being limited to the embodiments set forth herein. Rather, these embodiments are provided so that this disclosure will be thorough and complete, and will fully convey the scope of the invention to those skilled in the art. Like reference numerals refer to like elements throughout.

If not defined otherwise, all terms (including technical and scientific terms) in the specification may be defined as commonly understood by one skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

As used herein, the expression that "not including cadmium (or other heavy metal)" or "substantially free of cadmium (or other heavy metal)" include the case where a concentration of the cadmium (or other heavy metal) may be less than or equal to about 100 ppm, less than or equal to about 50 ppm, less than or equal to about 10 ppm, or almost zero. In an embodiment, substantially no amount of the cadmium (or other heavy metal) is present or, if present, an amount of the cadmium (or other heavy metal) is less than or equal to a detection limit or as an impurity level of a given analysis tool (e.g., an inductively coupled plasma atomic emission spectroscopy).

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless a definition is otherwise provided, the term "substituted" refers to a compound or a group or a moiety wherein at least one hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group or amine group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, unless a definition is otherwise provided, the term "hetero" refers to a compound or group that includes at least one (e.g., one to three) heteroatom(s), wherein the heteroatom(s) is each independently N, O, S, Si, P, or a combination thereof.

As used herein, unless a definition is otherwise provided, the term "alkylene group" refers to a straight or branched chain, saturated aliphatic hydrocarbon group having a valence of at least two. The alkylene group may be optionally substituted with one or more substituents.

As used herein, unless a definition is otherwise provided, the term "arylene group" refers to a functional group having a valence of at least two and formed by the removal of at least two hydrogen atoms from one or more rings of an aromatic hydrocarbon, wherein the hydrogen atoms may be removed from the same or different rings (preferably different rings), each of which rings may be aromatic or nonaromatic. The arylene group may be optionally substituted with one or more substituents.

As used herein, unless a definition is otherwise provided, the term "(meth)acrylate" refers to acrylate, and/or methacrylate, or a combination thereof. The (meth)acrylate may include a (C1 to C10 alkyl)acrylate, a (C1 to C10 alkyl) methacrylate, or a combination thereof.

As used herein, a photoconversion efficiency refers to a ratio of an amount of emitted light with respect to an amount of absorbed light of a quantum dot-polymer composite, where the absorbed light accounts for a portion of incident light (e.g., blue light) projected onto the quantum dot-polymer composite. The total light amount (B) of incident light may be obtained by integration of a photoluminescence (PL) spectrum of the incident light. The PL spectrum of the quantum dot-polymer composite film is measured to obtain a dose (A) of light in a green or red light wavelength region emitted from the quantum dot-polymer composite film and a dose (B) of incident light passing through the quantum dot-polymer composite film, and a photoconversion efficiency is obtained by the following equation:

$A/(B-B') \times 100\%$ = photoconversion efficiency (%)

$(B-B')/B \times 100\%$ = a blue (light) absorption rate of a film (%)

As used herein, unless a definition is otherwise provided, the term "dispersion" refers to a system in which a dispersed phase is a solid and a continuous phase includes a liquid. For example, the term "dispersion" may refer to a colloidal dispersion, wherein the dispersed phase includes particles having a dimension of at least about 1 nm (e.g., at least about 2 nm, at least about 3 nm, or at least about 4 nm) and less than or equal to about several micrometers (μm) (e.g., 2 μm or less, or 1 μm or less).

In the specification, the term "Group" in the Group III, Group II, or the like refers to a group of the Periodic Table of Elements.

As used herein, "Group I" refers to Group IA and Group IB, and may include Li, Na, K, Rb, and Cs but are not limited thereto.

As used herein, "Group II" refers to Group IIA and a Group IIB, and examples of the Group II metal may include Cd, Zn, Hg, and Mg, but are not limited thereto.

As used herein, "Group III" refers to Group IIIA and Group IIIB, and examples of the Group III metal may include Al, In, Ga, and Tl, but are not limited thereto.

As used herein, "Group IV" refers to Group IVA and Group IVB, and examples of the Group IV metal may include Si, Ge, and Sn but are not limited thereto. As used herein, the term "a metal" may include a semi-metal such as Si.

As used herein, "Group V" refers to Group VA and may include nitrogen, phosphorus, arsenic, antimony, and bismuth but is not limited thereto.

As used herein, "Group VI" refers to Group VIA and may include sulfur, selenium, and tellurium, but is not limited thereto.

As used herein, the term "first absorption peak wavelength" refers to a wavelength of a main excitonic peak (e.g., appearing first) from the longest wavelength region of a UV-vis absorption spectrum of a quantum dot (i.e., the main excitonic peak (e.g., appearing) at the lowest energy region in the UV-Vis absorption spectrum).

A semiconductor nanocrystal particle (also referred to as a quantum dot) is a nano-sized crystalline material. The semiconductor nanocrystal particle may have a large surface area per unit volume due to a relatively small size of the semiconductor nanocrystal particle and may exhibit different characteristics from a bulk material having the same composition due to a quantum confinement effect. Quantum dots may absorb light from an excitation source to be excited, and may emit energy corresponding to an energy bandgap of the quantum dots.

The quantum dots have potential applicability in various devices (e.g., an electronic device) due to unique photoluminescence characteristics of the quantum dots.

In order to be used in a photoluminescent color filter, the quantum dots may have to have enhanced optical properties (e.g., luminous or absorption rate) and stability that allows the quantum dots to maintain their luminous properties even after being exposed to the temperatures and chemical conditions necessary for a patterning process.

Quantum dots having properties applicable to an actual electronic device may include cadmium, and are often referred to in the art as cadmium-based quantum dots. However, cadmium is often associated with serious environment/health impact or concerns, and thus, is a restricted element for many commercial applications, e.g., consumer applications or products. As a type of quantum dot, a Group III-V-based nanocrystal, which does not include (e.g. is substantially free of) cadmium (hereinafter, a cadmium-free quantum dot) has been extensively researched. However, many of the cadmium-free quantum dots have technological drawbacks or limits in comparison with cadmium-based quantum dots. As noted in terms of stability, e.g., thermal stability, when the cadmium-free quantum dots undergo various manufacturing processes applicable to the making of an electronic device, the cadmium-free quantum dots may exhibit a sharp decrease in luminous or other optical properties.

Quantum dots often use blue light (e.g., having a wavelength of about 450 nm) as an excitation energy source in the application of an electronic device, e.g., an electronic display device. Contrary to the cadmium-based quantum dots that generally have a high level of blue light absorption, most of the presently known cadmium-free quantum dots (e.g., quantum dots emitting green light) has the absorption value (e.g. absorption intensity or absorbance) of blue light (e.g., having a wavelength of about 450 nm) that may not be enough for excitation, and this may lead to a decreased brightness of the display device.

In the cadmium-free quantum dot, introduction of a core-shell structure has been demonstrated to enhance or improve upon luminous properties and thermal stability. For example, an InP based core may be passivated with a ZnSe/ZnS shell of an increased thickness, which is then applied in a quantum dot polymer composite pattern. Although the increased thickness of a (e.g., ZnSe/ZnS) shell may be desirable to achieve an appropriate level of stability and luminous property, the increase in the shell thickness will also cause an increase in a weight (or a relative weight) of each quantum dot. The increase in the weight of each quantum dot will then lead to a decrease in the number density of quantum dots per a given weight of quantum dot polymer composite, e.g., in an emission layer of a display device, and therefore, a decrease in excitation light absorption of a quantum dot-polymer composite.

If the quantum dot is used in a patterned quantum dot-polymer composite film such as a color filter, the decrease in the excitation light absorption may be a direct cause of blue light leakage in a display device, which may adversely affect a color gamut (e.g., a coverage rate under a DCI standard), and result in a decrease of luminous efficiency.

A quantum dot based display device may exhibit improved color purity, luminance, and the like. For example, a liquid crystal display (hereinafter, LCD) realizes colors by polarized light passing through an absorption type color filter after passing through a liquid crystal. As a result, LCD has an issue of a narrow viewing angle and low light transmittance due to the absorption type color filter. On the other hand, a quantum dot may emit light having theoretical quantum efficiency (QY) of about 100% and high color purity (e.g., less than or equal to about 40 nm of a full width at half maximum (FWHM)) and thus achieve increased luminous efficiency and improved color reproducibility. Accordingly, the absorption type color filter may be replaced with a photoluminescent type color filter that includes quantum dots described herein to realize a wider viewing angle and improved luminance.

The quantum dot may be dispersed in a host matrix (e.g., including a polymer and/or an inorganic material) to form a quantum dot polymer composite (hereinafter, also can be simply referred to as "composite") that is then applied to the making of an electronic device, e.g., a display device. The realization of a quantum dot polymer composite, or a color filter including the quantum dot polymer composite, in a display device having a high brightness, a wide viewing angle, and high color reproducibility is of commercial importance, and therefore, of technical interest. However, the weight of the quantum dots that can be included in the composite for such an application may be limited due to various process-related reasons. Therefore, it would be desired to develop quantum dots that can exhibit enhanced blue light absorption rate together with improved brightness and thermal stability.

The quantum dot(s) of an embodiment may show enhanced luminous (or optical) properties and stability, e.g., processing or thermal stability, even in the absence of cadmium, e.g., even when a quantum dot that is substantially free of cadmium. As used herein, the term "quantum dot" may refer to a single particle or a plurality thereof.

In an embodiment, the quantum dot does not include cadmium. In an embodiment, the quantum dot is substantially free of cadmium. The quantum dot has a maximum photoluminescent peak in a green light wavelength region. The green light wavelength region may be greater than or equal to about 500 nm, greater than or equal to about 510 nm, greater than or equal to about 520 nm, greater than or equal to about 525 nm, greater than or equal to about 530 nm, or greater than or equal to about 535 nm and/or less than or equal to about 560 nm, less than or equal to about 550 nm, less than or equal to about 545 nm, less than or equal to about 540 nm, or less than or equal to about 539 nm. In an embodiment, the maximum photoluminescent peak may be present in any of the aforementioned range, for example, in a range of greater than or equal to about 530 nm and less than or equal to about 540 nm.

The quantum dot includes a semiconductor nanocrystal core including indium (In) and phosphorous (P), and a semiconductor nanocrystal shell disposed on the semiconductor nanocrystal core and including zinc, selenium, and sulfur.

In an embodiment, the quantum dot may have a core-multishell structure. In an embodiment, the quantum dot may include a core including an indium phosphide (e.g., InP or InZnP), a first shell layer disposed on (or directly on) the core and including Zn and Se, (e.g., ZnSe) and a second shell layer disposed on (or directly on) the first shell layer, having a different composition than the first shell layer, and including Zn and S (e.g., ZnS). In an embodiment, the quantum dot does not include an alkane monothiol compound on a surface thereof.

In an embodiment, the semiconductor nanocrystal core may include InP or InZnP. The term "InZnP" may include an alloy of an indium phosphide and zinc phosphide and a material wherein zinc is included in an indium phosphide for example in a doped or coated form.

The core may have a size of greater than or equal to about 1 nm, greater than or equal to about 1.5 nm, or greater than or equal to about 2 nm. In an embodiment, a size of the core may be less than or equal to about 4 nm, less than or equal to about 3 nm, or less than or equal to about 2.7 nm (e.g., less than or equal to about 2.5 nm).

As used herein, the wording "size" may be a size of a single entity or an average size of a plurality thereof.

The present inventors have found that in case of a quantum dot having an InP based core and a shell including Zn, Se and S, it can be difficult to achieve an improved quality of a shell coating or to avoid non-uniformity shell coating, for example, due to an oxidation phenomenon prior to and/or during the step of shell passivation, or a difference between the crystal lattices of the core and the shell materials. An increase of surface oxidation of the InP core may also result in a substantial decrease of luminous efficiency as excitons are predominantly generated in the core. In addition, as the non-uniformity shell coating cannot sufficiently separate the core and the surface of the quantum dot, defects on the surface of the quantum dot may result in a decrease of quantum efficiency. According to the research of the present inventors, this can be a reason for a decrease in quantum efficiency following a color filter process step (e.g., a high temperature treatment step).

Although an increase of a shell thickness may in-part resolve or minimalize the issue of non-uniformity of the shell layer, a thick shell fora cadmium-free core-shell quantum dot may result in a substantial increase in the weight of the quantum dots, which in turn results in a decrease in number density of quantum dots in the quantum dot-polymer composite per a given weight of the composite. Particularly, in a quantum dot based color filter, it is desirable to maximize the number density of quantum dots per a given weight of the composite. Accordingly, the application of a thick-shell quantum dot strategy may not be the best solution in a cadmium-free quantum dot based color filter.

Therefore, it is desirable to develop a cadmium-free quantum dot that has a relatively thin shell for increasing the number density of quantum dots per a given weight of the composite and that maintains or improves luminous efficiency and/or stability to a desired level at the same time.

Surprisingly, the present inventors have identified that a shape of an UV-Vis absorption spectrum (e.g., a first absorption peak, a valley adjacent thereto) and a ratio between the intensities of an absorption at 450 nm and the first absorption peak wavelength) may have some relationship with a degree of the oxidation of the core and uniform coating quality of the semiconductor nanocrystal core.

As represented in FIG. 1, in an ultraviolet-visible (UV-Vis) absorption spectrum of a quantum dot of an embodiment, a ratio of an absorption value (c) at 450 nm ($A_{450}$) to an absorption value (a) at a first absorption peak (1) ($A_{first}$) (i.e., $A_{450}/A_{first}$ or c/a) is greater than or equal to about 0.7, and a valley depth (VD) defined by the following equation is greater than or equal to about 0.4, for example, greater than or equal to about 0.41, greater than or equal to about 0.42, greater than or equal to about 0.45, or greater than or equal to about 0.5:

$$1-(Abs_{valley}/Abs_{first})=VD$$

wherein, $Abs_{first}$ is an absorption value or absorbance (a) at the first absorption peak (1) wavelength, and $Abs_{valley}$ is an absorption value or absorbance (b) at a lowest point of the valley adjacent to the first absorption peak (1).

An absorption value can be determined from an absorbance spectrum (i.e. a UV-Vis Absorption Spectroscopy) using a commercial spectrophotometer (for example, a Cary series manufactured by Agilent Technology or Shimadzu).

As used herein, the valley of the UV-Vis absorption spectrum refers to a portion of the spectrum (2) where a slope of a tangent line of a UV-Vis absorption spectrum curve changes from a negative value to a positive value, as a wavelength increases. The valley portion may exist near (adjacent to) the first absorption peak (1) (see FIG. 1).

The UV-Vis spectroscopy is related to a measurement of light in the visible and adjacent (near ultraviolet and near infrared) ranges. The UV-Vis spectroscopy is based on absorbance or absorption value. In spectroscopy, the absorption value or absorbance A can be defined as:

$$A_\lambda=\log_{10}(I_0/I)$$

where I is the intensity of light at a specified wavelength $\lambda$ that has passed through a sample (transmitted light intensity) and $I_0$ is the intensity of the light before it enters the sample or incident light.

For a green light emitting quantum dot having a InP based core and a shell including Zn, Se, and S (e.g., a ZnSe/ZnS shell), the present inventors have used an effective mass approximation and obtained an absorption spectrum and an energy level that contributes to each of a $1^{st}$ absorption and a $2^{nd}$ absorption in a InP/ZnSe/ZnS QD, and a wavefunction distribution corresponding to each energy level in a quantum dot structure. As a result, the present inventors have identified that an intensity at a wavelength corresponding to the $2^{nd}$ absorption peak is the absorption intensity at 450 nm that is important to be used in a quantum dot color filter, and the corresponding wave-function relates to not only the InP core but also a substantial portion of the ZnSe shell and a portion of the ZnS shell in a two layer shell structure. Without wishing to be bound to any theory, such results indicate that in the UV-vis absorption spectrum, the second absorption peak may be indicative of the character of the ZnSe and the ZnS shell layers. Upon further analysis of the absorption spectrum during shell formation, the $1^{st}$ and the $2^{nd}$ absorption peaks in the absorption spectrum can be mathematically separated with a Gaussian function fitting. Accordingly, the present inventors have identified that with the addition of the second shell layer, ZnS, the $2^{nd}$ absorption peak may be blue-shifted with increasing intensity.

Without wishing to be bound by any theory, the spectroscopic results may also suggest that the forming of the aforementioned two shell layers may result in a hybridization between the shell layers (for example, ZnSe and ZnS) at an energy level relating to the $2^{nd}$ absorption peak and an increase of the energy level. In case of a cadmium-free quantum dot having the InP core and the shell including Zn, Se, and S, the valley depth (VD) present in the UV-Vis absorption spectrum may represent the degree of hybridization between the shell components. In other words, from the spectroscopic data, the increased valley depth in the UV-Vis absorption spectrum may suggest that the shell components (e.g., ZnSe and ZnS) are coated more uniformly, and the junction area between them increases as well. Accordingly, the quantum dots of the embodiment may have the aforementioned VD value, thereby exhibiting an increased quantum efficiency together with an enhanced process stability.

However, according to the additional research of the present inventors, the increased VD value may be not exclusively and entirely related to all of the aforementioned technical results. If the contribution of the ZnSe component is insufficient among the shell components (e.g. two shell layers), the contribution of the ZnS component becomes relatively greater, which may result in the increase of the VD as well. In such case, even with a large value of the VD, a physical distance between the core and the final surface becomes insufficient for the quantum dot and thus its corresponding surface state may have a detrimental effect on the core and the process stability in terms of luminous properties of the quantum dot may be sharply decreased.

In the quantum dot of the embodiment, the ZnSe shell layer is sufficiently present (e.g., at a predetermined thickness or greater), which may be confirmed by the absorption value (or intensity) at 450 nm with respect to the first absorption value (e.g., intensity) at the first absorption wavelength, and thus the quantum dot may have the aforementioned ratio of the absorption value at 450 nm with respect to the absorption value at the first absorption wavelength.

The quantum dot of the embodiment may have the aforementioned (compositional) structure and the aforementioned VD value as well as the aforementioned ratio of absorption (value or intensity) at 450 nm to the absorption (value or intensity) at the first peak wavelength. Accordingly, the quantum dot may exhibit improved optical properties (e.g., increased luminous efficiency and an increased excitation absorption rate). The quantum dot may also exhibit a relatively enhanced coating quality for a shell, which may in turn maximize an electronic barrier function of the shell. The quantum dot of the embodiment may be used in the formation of the quantum dot polymer composite pattern.

In the quantum dot of the embodiment, the enhanced coating quality of the shell layer(s) may make it possible for the quantum dots to have a relatively reduced weight together with improved stability (thermal stability) and enhanced optical properties, and thus, the number density of the quantum dots that can be included for a given weight of quantum dot in a quantum dot composite would also increase. Therefore, the quantum dot of the embodiment may be used in a photoluminescent color filter.

In the UV-Vis absorption spectrum of the quantum dot, a ratio $A_{450}/A_{first}$ i.e., a ratio of an absorption value at 450 nm to an absorption value at the first absorption peak may be greater than or equal to about 0.71, greater than or equal to about 0.72, greater than or equal to about 0.73, greater than or equal to about 0.74, greater than or equal to about 0.75, greater than or equal to about 0.76, greater than or equal to about 0.77, or greater than or equal to about 0.78. The valley depth may be greater than or equal to about 0.41, greater than or equal to about 0.45, greater than or equal to about 0.5, greater than or equal to about 0.52, or greater than or equal to about 0.53.

In a quantum dot of an embodiment, a mole ratio of sulfur with respect to selenium (S/Se) may be less than or equal to about 2.5:1. In a quantum dot of an embodiment (e.g., a QD emitting green or red light), a mole ratio of sulfur with respect to selenium may be less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, less than or equal to about 0.9:1, or less than or equal to about 0.8:1, less than or equal to about 0.7:1, less than or equal to about 0.65:1, or less than or equal to about 0.6:1. In a quantum dot of an embodiment, a mole ratio of sulfur with respect to selenium may be greater than or equal to about 0.05:1, greater than or equal to about 0.07:1, greater than or equal to about 0.1:1, greater than or equal to about 0.2:1, greater than or equal to about 0.3:1, greater than or equal to about 0.4:1, or greater than or equal to about 0.5:1.

In an embodiment of a quantum dot, a mole ratio of zinc with respect to indium of greater than or equal to about 10:1, greater than or equal to about 15:1, greater than or equal to about 20:1, greater than or equal to about 25:1, greater than or equal to about 30:1, or greater than or equal to about 35:1.

In an embodiment of a quantum dot, a mole ratio of zinc with respect to indium may be less than or equal to about 50:1, less than or equal to about 49:1, less than or equal to about 48:1, less than or equal to about 47:1, less than or equal to about 46:1, less than or equal to about 45:1, less than or equal to about 44:1, less than or equal to about 43:1, less than or equal to about 42:1, less than or equal to about 41:1, less than or equal to about 40:1, less than or equal to about 39:1, less than or equal to about 38:1, or less than or equal to about 35:1.

In an embodiment of a quantum dot, a mole ratio of a total sum of sulfur and selenium with respect to indium (Se+S)/In may be greater than or equal to about 10:1, greater than or equal to about 15:1, greater than or equal to about 19:1, greater than or equal to about 20:1, greater than or equal to about 21:1, greater than or equal to about 22:1, greater than or equal to about 23:1, greater than or equal to about 24:1, greater than or equal to about 25:1, greater than or equal to about 26:1, greater than or equal to about 27:1, greater than or equal to about 28:1, greater than or equal to about 29:1, or greater than or equal to about 30:1. In an embodiment of a quantum dot, a mole ratio of a total sum of sulfur and selenium with respect to indium (Se+S)/In may be less than or equal to about 40:1, less than or equal to about 39:1, less than or equal to about 38:1, less than or equal to about 37:1, less than or equal to about 36:1, less than or equal to about 35:1, less than or equal to about 34:1, less than or equal to about 33:1, or less than or equal to about 32:1.

The semiconductor nanocrystal shell may include a first shell layer including zinc and selenium and a second shell layer disposed on the first shell layer and including zinc and sulfur. The first shell layer may be disposed directly on the core. The first shell layer may include ZnSe, ZnSeS, or a combination thereof. The first shell layer may not include sulfur.

In an embodiment, a thickness of the first shell layer may be greater than or equal to about 3 monolayers (ML), for example, greater than or equal to about 3.5 ML, greater than or equal to about 3.6 ML, greater than or equal to about 3.7 ML, greater than or equal to about 3.8 ML, greater than or equal to about 3.9 ML, or greater than or equal to about 4 ML. In an embodiment, a thickness of the first shell layer may be less than or equal to about 7 ML, for example less than or equal to about 6 ML, or less than or equal to about 5 ML.

In an embodiment, a thickness of the first shell layer may be greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, greater than or equal to about 1.5 nm, or greater than or equal to about 1.6 nm, and/or less than or equal to about 2.5 nm, less than or equal to about 2 nm, less than or equal to about 1.9 nm, less than or equal to about 1.8 nm, less than or equal to about 1.75 nm, less than or equal to about 1.7 nm, less than or equal to about 1.4 nm, less than or equal to about 1.3 nm, or less than or equal to about 1.25 nm.

The second shell layer may include ZnS. The second shell layer may not include selenium. The second shell layer may be disposed directly on the first layer. The second shell layer may be an outermost layer of the quantum dot.

In an embodiment, a thickness of the second shell layer may be less than or equal to about 0.7 nm, for example, less than about 0.7 nm, less than or equal to about 0.65 nm, less than or equal to about 0.64 nm, less than or equal to about 0.63 nm, less than or equal to about 0.62 nm, less than or equal to about 0.61 nm, less than or equal to about 0.6 nm, less than or equal to about 0.59 nm, less than or equal to about 0.58 nm, less than or equal to about 0.57 nm, less than or equal to about 0.56 nm, less than or equal to about 0.55 nm, less than or equal to about 0.54 nm, or less than or equal to about 0.53 nm.

In an embodiment, a thickness of the second shell layer may be greater than or equal to about 0.15 nm, greater than or equal to about 0.16 nm, greater than or equal to about 0.17 nm, greater than or equal to about 0.18 nm, greater than or equal to about 0.19 nm, greater than or equal to about 0.2 nm, greater than or equal to about 0.21 nm, greater than or equal to about 0.22 nm, greater than or equal to about 0.23 nm, greater than or equal to about 0.24 nm, greater than or equal to about 0.25 nm, greater than or equal to about 0.26 nm, or greater than or equal to about 0.27 nm.

In an UV-Vis absorption spectrum of the quantum dot, the first absorption peak may be present in a wavelength range of greater than about 450 nm and less than a maximum photoluminescent peak wavelength. The first absorption peak wavelength may be greater than or equal to about 455 nm, for example, greater than or equal to about 460 nm, greater than or equal to about 465 nm, greater than or equal to about 470 nm, greater than or equal to about 475 nm, greater than or equal to about 480 nm, greater than or equal to about 485 nm, or greater than or equal to about 490 nm. The first absorption peak wavelength may be less than or equal to about 520 nm, less than or equal to about 515 nm, or less than or equal to about 510 nm.

The valley or a lowest point thereof adjacent to the first absorption peak may be present in a wavelength range of greater than or equal to about 420 nm, for example, greater than or equal to about 425 nm, greater than or equal to about 430 nm, greater than or equal to about 435 nm, greater than or equal to about 440 nm, greater than or equal to about 445 nm, greater than or equal to about 450 nm, greater than or equal to about 455 nm, or greater than or equal to about 460 nm. The valley or a lowest point thereof adjacent to the first absorption peak may be present in a wavelength range of less than or equal to about 490 nm, for example, less than or equal to about 485 nm, less than or equal to about 480 nm, less than or equal to about 475 nm, or less than or equal to about 470 nm.

In an embodiment, a size (or an average size) of the quantum dot may be greater than or equal to about 1 nm, greater than or equal to about 2 nm, greater than or equal to about 3 nm, greater than or equal to about 4 nm, or greater than or equal to about 5 nm. In an embodiment, a size (or an average size) of the quantum dot may be less than or equal to about 30 nm, for example, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, or less than or equal to about 7 nm.

The size of the quantum dot may be a diameter of a particle. In the case of a non-spherically shaped particle, the size of the quantum dot may be calculated by converting a (e.g., two-dimensional) area of an electron microscopic image of the particle into a circle (e.g., an equivalent circle area).

In an embodiment, the size (or an average size) of the core may be selected appropriately in light of a desired luminescent wavelength of the quantum dot. For example, the size (or an average size) of the core may be greater than or equal to about 1 nm, greater than or equal to about 1.5 nm, or greater than or equal to about 2 nm. The size (or an average size) of the core may be less than or equal to about 5 nm, less than or equal to about 4 nm, less than or equal to about 3 nm, less than or equal to about 2.5 nm, or less than or equal to about 2 nm.

In an embodiment, a thickness of the shell may be greater than or equal to about 0.5 nm, greater than or equal to about 0.6 nm, greater than or equal to about 0.7 nm, greater than or equal to about 0.8 nm, or greater than or equal to about 0.9 nm. In an embodiment, a thickness of the shell may be less than or equal to about 3 nm, less than or equal to about 2.5 nm, less than or equal to about 2 nm, less than or equal to about 1.9 nm, less than or equal to about 1.5 nm, less than or equal to about 1.2 nm, less than or equal to about 1 nm, or less than or equal to about 0.9 nm.

The quantum dot may constitute a population of quantum dots exhibiting an improved size distribution. In an embodiment, a population or a plurality of quantum dots may have a size distribution (a standard deviation) of less than or equal to about 30%, less than or equal to about 20%, less than or equal to about 15%, less than or equal to about 14%, less than or equal to about 13%, less than or equal to about 12%, less than or equal to about 11%, or less than or equal to about 10%.

A shape of the quantum dot is not particularly limited, may for example be a spherical, polyhedron, pyramid, multi-pod, or cubic shape, nanotube, nanowire, nanofiber, nanosheet, or a combination thereof, but is not limited thereto.

The quantum dot may have a quantum efficiency of greater than or equal to about 70%, for example, greater than or equal to about 72%, greater than or equal to about 75%, greater than or equal to about 80%, greater than or equal to about 85%, greater than or equal to about 86%, greater than or equal to about 87%, greater than or equal to about 88%, greater than or equal to about 89%, or greater than or equal to about 90%. The quantum dot may exhibit a maximum photoluminescence peak with a full width at half maximum of less than or equal to about 50 nm, or less than or equal to about 45 nm.

In an embodiment, "quantum yield (or quantum efficiency)" is a ratio of photons emitted to photons absorbed, e.g., by a nanostructure or population of nanostructures. In an embodiment, the quantum efficiency may be determined by any method. For example, there may be two methods for measuring the fluorescence quantum yield or efficiency: the absolute method and the relative method. The absolute method directly obtains the quantum yield by detecting all sample fluorescence through the use of an integrating sphere. The relative method compares the fluorescence intensity of a standard sample with the fluorescence intensity of an unknown sample to calculate the quantum yield of the unknown sample. The QY may be readily determined by using commercially available equipment.

The quantum dot may include an organic ligand, an organic solvent, or a combination thereof, which will be described below, on a surface of the quantum dot. The organic ligand, the organic solvent, or a combination thereof may be bound to a surface of the quantum dot.

In an embodiment, the quantum dot may be prepared by a method including obtaining the semiconductor nanocrystal core and forming the semiconductor nanocrystal shell, wherein reaction conditions (the temperature/time/the amount of the precursor) for the shell formation is controlled so that a resulting quantum dot may satisfy the aforementioned composition while exhibiting the UV-Vis spectrum having the aforementioned features.

In an embodiment, the method may include:

obtaining a first mixture including a zinc containing precursor (hereinafter, zinc precursor), an organic ligand, and an organic solvent;

optionally heating the first mixture;

injecting a semiconductor nanocrystal core including indium and phosphorous and a selenium containing precursor to the (optionally heated) first mixture to obtain a second mixture;

heating the second mixture at a first reaction temperature and maintaining the first reaction temperature for at least about 40 minutes, for example, at least about 50 minutes, at least about 60 minutes, at least about 70 minutes, or at least about 80 minutes, to obtain a third mixture including a particle including a first shell layer including zinc and selenium formed on the semiconductor nanocrystal core;

injecting a sulfur containing precursor (e.g., a stock solution including the sulfur containing precursor) into the third mixture at the first reaction temperature to form a second shell layer on the first shell layer.

In the method, an amount of the selenium containing precursor and an amount of the sulfur containing precursor with respect to the core in the second mixture and the third mixture are controlled, respectively, and independently of one another (and optionally controlling a duration of a reaction in each step) in order for a resulting quantum dot to achieve the aforementioned shell composition and to exhibit the aforementioned UV-Vis absorption spectrum.

Details of the quantum dot, the semiconductor nanocrystal core, the semiconductor nanocrystal shell (e.g., the first shell layer and the second shell layer) are the same as set forth above.

The zinc precursor is not particularly limited. In an embodiment, the zinc precursor may include a Zn metal powder, an alkylated Zn compound (e.g., dimethyl zinc, diethyl zinc, or a combination thereof), a Zn alkoxide, a Zn carboxylate (e.g., zinc acetate), a zinc carbonate, a Zn nitrate, a Zn perchlorate, a Zn sulfate, a Zn acetylacetonate, a Zn halide (e.g., zinc chloride, zinc bromide, zinc iodide, zinc fluoride, or a combination thereof), a Zn cyanide, a Zn hydroxide, a Zn oxide, a Zn peroxide, or a combination thereof.

Examples of the zinc precursor may include, but are not limited to dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. The zinc containing precursor may be used alone or in a combination of two or more of the above precursor compounds.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$ (wherein R and R' are the same or different, and are independently a substituted or unsubstituted C1 to C40 (or C3 to C24) aliphatic hydrocarbon group (e.g., an alkyl group, an alkenyl group, or an alkynyl group), a substituted or unsubstituted C6 to C40 aromatic hydrocarbon group (such as a C6 to C20 aryl group), a polymeric organic ligand, or a combination thereof.

The organic ligand may coordinate to, e.g., be bound to, the surface of the obtained nanocrystal and help the nanocrystal to be well dispersed in the solution, and may also affect light emitting and/or electrical characteristics of quantum dots.

Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, or substituted or unsubstituted octylphosphine (e.g., trioctylphosphine (TOP)); phosphine oxide such as substituted or unsubstituted methyl phosphine oxide (e.g., trimethyl phosphine oxide, methyldiphenyl phosphine oxide, etc.), substituted or unsubstituted ethyl phosphine oxide (e.g., triethyl phosphine oxide, ethyldiphenyl phosphine oxide, etc.), substituted or unsubstituted propyl phosphine oxide, substituted or unsubstituted butyl phosphine oxide, or substituted or unsubstituted octyl phosphine oxide (e.g., trioctylphosphine oxide (TOPO); diphenyl phosphine, triphenyl phosphine, diphenyl phosphine oxide, or triphenyl phosphine oxide; an alkylphosphinic acid for example, a C5 to C20 alkyl phosphinic acid (e.g., hexyl phosphinic acid, octyl phosphinic acid, dodecanyl phosphinic acid, tetradecanyl phosphinic acid, hexadecanyl phosphinic acid, octadecanyl phosphinic acid, or the like, an alkyl phosphonic acid such as a C5 to C20 alkyl phosphonic acid; or the like, but are not limited thereto. The organic ligand may be used alone or as a mixture of at least two ligand compounds.

The organic solvent may a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof.

Types and amounts of the organic solvent may be appropriately selected considering precursors and organic ligands.

The first mixture may be heated to a predetermined temperature (e.g., of greater than or equal to about 100° C., for example, greater than or equal to about 120° C., greater than or equal to about 150° C., greater than or equal to about 200° C., greater than or equal to about 250° C., or greater than or equal to about 270° C.) and less than or equal to about the first reaction temperature under vacuum, an inert atmosphere, or a partial vacuum/inert atmosphere.

Details of the semiconductor nanocrystal core including indium and phosphorous are the same as set forth above. The core may be commercially available or may be prepared in any appropriate method. The preparation of the core is not particularly limited and may be performed in any method of producing an indium phosphide based core. In an embodiment, the core may be synthesized in a hot injection manner wherein a solution including a metal containing precursor (e.g., an indium containing precursor) and optionally an organic ligand is heated at a high temperature (e.g., of greater than or equal to about 200° C.) and then a phosphorous containing precursor is injected the heated hot solution.

The selenium containing precursor is not particularly limited and may be desirably selected. In an embodiment, the selenium containing precursor includes selenium-trioctyl phosphine (Se-TOP), selenium-tributyl phosphine (Se-TBP), selenium-triphenyl phosphine (Se-TPP), telluriumtributylphosphine (Te-TBP), or a combination thereof but is not limited thereto.

The first reaction temperature may be selected appropriately and, for example, may be greater than or equal to about 280° C., greater than or equal to about 290° C., greater than or equal to about 300° C., greater than or equal to about 310° C., or greater than or equal to about 315° C. and less than or equal to about 390° C., less than or equal to about 380° C., less than or equal to about 370° C., less than or equal to about 360° C., less than or equal to about 350° C., less than or equal to about 340° C., or less than or equal to about 330° C.

After or during the heating of the second mixture to the first reaction temperature, a selenium containing precursor may be injected at least one time (e.g., at least twice, at least three times, at least four times, or at least five times) for example, at a limited concentration such as less than 1 M, or less than 0.5 M) for example with a predetermined time interval or successively.

The reaction time (keeping the second mixture at the first reaction temperature) may be greater than or equal to about 40 minutes, for example, greater than or equal to about 50 minutes, greater than or equal to about 60 minutes, greater than or equal to about 70 minutes, greater than or equal to about 80 minutes, or greater than or equal to about 90 minutes, and less than or equal to about 4 hours, for example, less than or equal to about 3 hours, or less than or equal to about 2 hours to form a third mixture including a particle having a $1^{st}$ layer including zinc and selenium disposed on the semiconductor nanocrystal core.

By the reaction at the first reaction temperature for the aforementioned time period, the first shell layer including the zinc and the selenium and having a thickness of greater than or equal to about 1 monolayer (ML), for example, greater than or equal to about 1.5 ML, greater than or equal to about 1.7 ML or greater than or equal to about 3 ML (or 1 ML to 2.5 ML or 1 ML to 2 ML) may be formed. In this case, in the second mixture, the amount of the selenium containing precursor with respect to the indium may be controlled such that during a predetermined reaction time, the first shell layer having a predetermined thickness (e.g., 0.5 nm or higher, 0.7 nm or higher, 0.9 nm or higher, 1 nm or higher, or 1.2 nm or higher) may be formed.

In an embodiment, the amount of the selenium per one mole of indium may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles, but is not limited there to. In an embodiment, the amount of the selenium per one mole of indium may be less than or equal to about 20 moles, less than or equal to about 18 moles, less than or equal to about 15 moles, less than or equal to about 10 moles, or less than or equal to about 9 moles, but is not limited thereto.

The third mixture may not include the sulfur containing precursor.

At the first reaction temperature, a stock solution including a sulfur containing precursor is added to the third mixture to form a second shell layer on the first shell layer.

In an embodiment, the method of making the quantum dot does not include lowering a temperature of the third mixture down at or below about 100° C., for example, less than or equal to about 50° C. (e.g., 30° C. or lower, or room temperature). In other words, the method may include maintaining a temperature of a reaction mixture including the particle having the first shell layer on the core at a temperature of greater than or equal to 100° C., for example, greater than or equal to 50° C., or greater than or equal to 30° C.

Types of the sulfur containing precursor are not particularly limited and may be selected appropriately. The sulfur containing precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfide, ammonium sulfide, sodium sulfide, or a combination thereof. The sulfur containing precursor may be injected at least one times (e.g., at least two times).

In order to facilitate the hybridization with the ZnSe shell component, the injection of the sulfur containing precursor may be carried out in a controlled manner (in terms of a concentration less than that of the selenium containing precursor at the formation of the first shell layer and in terms of time of less than or equal to about 3 hours) intermittently or continuously.

The duration for the formation of the second shell layer may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, or greater than or equal to about 35 minutes and less than or equal to about 3 hours, less than or equal to about 2 hours, less than or equal to about 1 hour, less than or equal to about 50 minutes, less than or equal to about 45 minutes, or less than or equal to about 40 minutes.

In an embodiment, an amount of sulfur with respect to one mole of indium in the third mixture may be controlled to obtain a desired shell composition (for example, such that the thickness thereof is less than or equal to about 0.7 nm) considering the reactivity of the precursor and the reaction temperature.

In an embodiment, the amount of sulfur with respect to one mole of indium in the third mixture may be greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. The amount of sulfur with respect to one mole of indium in the third mixture may be, less than or equal to about 45 moles, less than or equal to about 40 moles, less than or equal to about 35 moles, less than or equal to about 30 moles, less than or equal to about 25 moles, less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, or less than or equal to about 5 moles.

After the reaction, a non-solvent is added into the obtained final reaction solution to facilitate the precipitation of the organic ligand-coordinated quantum dots. The non-solvent may be a polar solvent that is miscible with the organic solvent used in the reaction and nanocrystals are not dispersible therein. The non-solvent may be selected depending on the organic solvent used in the reaction and may be for example, acetone, ethanol, butanol, isopropanol, ethane diol, water, tetrahydrofuran (THF), dimethyl sulfoxide (DMSO), diethyl ether, formaldehyde, acetaldehyde, a solvent having a similar solubility parameter to the foregoing solvents, or a combination thereof. The separation of the precipitated quantum dots may be performed through a centrifugation, precipitation, chromatography, or distillation. The separated nanocrystal may be added to a washing solvent and washed, if desired. The washing solvent is not particularly limited and may include a solvent having a similar solubility parameter to that of the organic ligand and may, for example, include hexane, heptane, octane, chloroform, toluene, benzene, and the like.

The quantum dots may be dispersed in a dispersing solvent. The quantum dots may form an organic solvent dispersion. The organic solvent dispersion may be free of water, may be free of a water miscible organic solvent, or a combination thereof. The dispersing solvent may be selected appropriately. The dispersing solvent may include (or consists of) the aforementioned organic solvent. The dispersing solvent may include (or consists of) a substituted or unsubstituted C1 to C40 aliphatic hydrocarbon, a substituted or unsubstituted C6 to C40 aromatic hydrocarbon, or a combination thereof.

In an embodiment, a composition includes: (for example, a plurality of) the aforementioned quantum dot(s); a dispersing agent (that may disperse the quantum dots and optionally may include a carboxylic acid group containing (binder) polymer; and an organic solvent (and/or a liquid vehicle). The composition may further include a polymerizable (e.g., photopolymerizable) monomer including a carbon-carbon double bond; and optionally an initiator (e.g., a photoinitiator or a thermal initiator). The composition may be photosensitive.

In the composition, details for the quantum dots are the same as set forth above. In the composition, the amount of the quantum dot may be selected appropriately in light of the types and amounts of other components in the composition and a final use thereof. In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total solid content of the composition. A weight percent of a component, based on a total solid content of the composition, may represent the amount of the component in the composite, which will be described below.

The composition of an embodiment may be used for providing a pattern including a quantum dot polymer composite. In an embodiment, the composition may be a photoresist composition that may be applicable to a photolithography process. In other embodiments, the composition may be an ink composition that may be applicable to an ink jet process (e.g., a liquid drop discharging method such as an ink jet printing). In an embodiment, the composition may not include a conjugated polymer (except for a cardo binder that will be described below). In an embodiment, the composition may include a conjugated (or electrically conductive) polymer. As used herein, the conjugated polymer may be a polymer including a conjugated double bond such as a polyphenylene vinylene.

In the composition of an embodiment, a dispersing agent is a compound capable of securing, e.g., improving, a dispersibility of the quantum dots. The dispersing agent may be a binder polymer. The binder polymer may include a carboxylic acid group (for example, in repeating units of the binder polymer). The binder polymer may be an (electrically) insulative polymer.

In an embodiment, the binder polymer may include:

a copolymer of a monomer combination including a first monomer, a second monomer, and optionally a third monomer, the first monomer including a carboxylic acid group and a carbon-carbon double bond, the second monomer including a carbon-carbon double bond and a hydrophobic moiety and not including a carboxylic acid group, and the third monomer including a carbon-carbon double bond and a hydrophilic moiety and not including a carboxylic acid group;

a multi-aromatic ring-containing polymer including a carboxylic acid group (—COOH) and including a backbone structure in a main chain (e.g., a backbone structure incorporated in the main chain), wherein the backbone structure includes a cyclic group including a quaternary carbon atom and two aromatic rings bound to the quaternary carbon atom (e.g., also known as a cardo binder);

or a combination thereof.

The copolymer may include a first repeating unit derived from the first monomer, a second repeating unit derived from the second monomer, and optionally a third repeating unit derived from the third monomer. Types and amounts of the first monomer, the second monomer, and the third monomer may be selected appropriately. As the copolymer including the first monomer, the second monomer, and optionally the third monomer, a conventional copolymer (a binder polymer soluble in an alkaline aqueous solution) used in a photoresist, which is commercially available.

In an embodiment, the binder polymer may include a multi-aromatic ring-containing polymer. The multi-aromatic ring-containing polymer is also known as a cardo binder, which may be commercially available, may be used.

The carboxylic acid group-containing binder may have an acid value of greater than or equal to about 50 milligrams of potassium hydroxide per gram (mg KOH/g). For example, the carboxylic acid group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g, but is not limited thereto. The carboxylic acid group-containing binder may have an acid value of less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The binder polymer (e.g., containing the carboxylic acid group, such as the carboxylic acid group-containing binder) may have a weight (or a number) average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a weight (or a number) average molecular weight of less than or equal to about 100,000 g/mol, for example, less than or equal to about 50,000 g/mol, less than or equal to about 25,000 g/mol, or less than or equal to about 10,000 g/mol.

In the composition, an amount of the dispersing agent (e.g., the binder polymer) may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight (or a total solid content) of the composition. In an embodiment, an amount of dispersing agent (e.g., the binder polymer or the carboxylic acid group-containing binder) may less than or equal to about 50 wt %, less than or equal to about 40 wt %, less than or equal to about 35 wt %, less than or equal to about 33 wt %, or less than or equal to about 30 wt %, based on a total weight (or a total solid content) of the composition.

In the composition according to an embodiment, the (photo)polymerizable monomer including at least one (e.g., at least two, at least three, or more) carbon-carbon double bond may include a (e.g., photopolymerizable) (meth)acrylate monomer. The (photo)polymerizable monomer may be a precursor for an insulative polymer. Examples of the (photo)polymerizable monomer may include, but are not limited to, a C1-C10-alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

The amount of the (photo)polymerizable monomer may be greater than or equal to about 0.5 wt %, for example, greater than or equal to about 1 wt %, or greater than or equal to about 2 wt % with respect to a total weight (or a total solid content) of the composition. The amount of the photopolymerizable monomer may be less than or equal to about 50 wt %, for example, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % with respect to a total weight (or a total solid content) of the composition.

The (photo) initiator included in the composition may be for the polymerization of the (photo)polymerizable monomer. The initiator may be a compound that can generate a radical species under a mild condition (e.g., by light or heat) to promote the initiation of a radical reaction (e.g., a radical polymerization of a monomer). The initiator may be a thermal initiator or a photoinitiator. The initiator is not particularly limited and may be selected appropriately.

Examples of the thermal initiator may include azobisisobutyronitrile (AIBN), benzoyl peroxide (BPO) or the like but are not limited thereto.

The photoinitiator may be a compound that can initiate a radical polymerization of the aforementioned photopolymerizable (e.g., acryl based) monomer, a thiol compound that will be described below, or a combination thereof. The photoinitiator is not particularly limited. The photoinitiator may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, an azo compound, a bis-imidazole compound, or a combination thereof.

In the composition of an embodiment, an amount of the initiator may be adjusted in light of the types and the amount of the (photo)polymerizable monomer as used. In an embodiment, the amount of the initiator may be greater than or equal to about 0.01 wt % or greater than or equal to about 1 wt % and less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight (or a total solid content) of the composition, but is not limited thereto.

The (photosensitive) composition may further include a thiol compound (e.g., a monothiol compound or a polythiol compound having two or greater thiol groups), a metal oxide fine particle, or a combination thereof.

When a plurality of metal oxide fine particles is present in the polymer matrix, the metal oxide fine particles may include $TiO_2$, $SiO_2$, $BaTiO_3$, $Ba_2TiO_4$, ZnO, or a combination thereof. A particle size (or an average particle size, hereinafter, referred to as particle size) of the metal oxide fine particles is not particularly limited and may be selected appropriately. The particle size of the metal oxide fine particles may be greater than or equal to about 100 nm, greater than or equal to about 150 nm, or greater than or equal to about 200 nm and less than or equal to about 1,000 nm, less than or equal to about 900 nm, or less than or equal to about 800 nm. The metal oxide fine particles may be non-light emissive.

An amount of the metal oxide fine particle may be less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, less than or equal to about 5 wt %, based on a total weight (or a total solid content) of the composition. An amount of the metal oxide fine particle may be greater than or equal to about 1 wt %, greater than or equal to about 5 wt %, greater than or equal to about 10 wt %, based on a total weight (or a total solid content) of the composition.

The polythiol compound may include a compound represented by Chemical Formula 1:

Chemical Formula 1

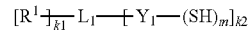

wherein, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group, wherein —NRR', wherein R and R' are independently hydrogen or C1 to C30 linear or branched alkyl group, but simultaneously not hydrogen; an isocyanate group; a halogen; —ROR', wherein R is a substituted or unsubstituted C1 to C20 alkylene group and R' is hydrogen or a C1 to C20 linear or branched alkyl group; an acyl halide, wherein —RC(=O)X, wherein R is a substituted or unsubstituted alkylene group and X is a halogen; —C(=O)OR', wherein R' is hydrogen or a C1 to C20 linear or branched alkyl group; —CN; —C(=O)NRR', wherein R and R' are independently hydrogen or a C1 to C20 linear or branched alkyl group; —C(=O)ONRR', wherein R and R' are independently hydrogen or a C1 to C20 linear or branched alkyl group; or a combination thereof, $L_1$ is a carbon atom, a substituted or unsubstituted C1 to C30 alkylene group, a substituted or unsubstituted C1 to C30 alkylene group wherein a methylene is replaced by a sulfonyl moiety, a carbonyl moiety, an ether moiety, a sulfide moiety, a sulfoxide moiety, an ester moiety, an amide moiety comprising hydrogen or a C1 to C10 alkyl group, or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond; a substituted or unsubstituted C1 to C30 alkylene group; a substituted or unsubstituted C2 to C30 alkenylene group; or a substituted or unsubstituted C1 to C30 alkylene group or a substituted or unsubstituted C2 to C30 alkenylene group wherein a methylene is replaced by a sulfonyl moiety, a carbonyl moiety, an ether moiety, a sulfide moiety, a sulfoxide moiety, an ester moiety, an amide moiety comprising hydrogen or a C1 to C10 linear or branched alkyl group, an imine moiety comprising hydrogen or a C1 to C10 linear or branched alkyl group, or a combination thereof, m is an integer of 1 or greater, k1 is 0 or an integer of 1 or greater, k2 is an integer of 1 or greater, and a sum of m and k2 is an integer of 3 or greater, provided that m does not exceed the valence of $Y_1$ and a sum of k1 and k2 does not exceed the valence of $L_1$.

The polythiol compound may include a dithiol compound, a trithiol compound, a tetrathiol compound, or a combination thereof. For example, the polythiol compound may include glycol di-3-mercaptopropionate (e.g., ethylene glycol di-3-mercaptopropionate), glycol dimercaptoacetate (e.g., ethylene glycol dimercaptoacetate), trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

Based on a total weight (or a total solid content) of the composition, an amount of the thiol compound may be less than or equal to about 50 wt %, less than or equal to about 40 wt %, less than or equal to about 30 wt %, less than or equal to about 20 wt %, less than or equal to about 15 wt %, or less than or equal to about 10 wt %. The amount of the thiol compound may be greater than or equal to about 1 wt %, for example, greater than or equal to about 5 wt %, greater than or equal to about 10 wt %, greater than or equal to about 15 wt %, or greater than or equal to about 20 wt %, based on a total weight (or a total solid content) of the composition.

The composition may further include an organic solvent (or a liquid vehicle) (hereinafter, simply referred to as "solvent"). The solvent is not particularly limited. Types and amounts of the solvent may be appropriately selected by considering the aforementioned main components (i.e., the quantum dot, the dispersing agent, the photopolymerizable monomer, the photoinitiator, and if used, the thiol compound), and types and amounts of additives which will be described below. The composition may include a solvent in a residual amount except for a desired amount of the solid content (non-volatile components).

The solvent may be appropriately selected by considering the other components (e.g., a binder, a photopolymerizable monomer, a photoinitiator, and other additives) in the composition, affinity for an alkali-developing solution, a boiling point, or the like. Non-limiting examples of the solvent may include, but are not limited to: ethyl 3-ethoxy propionate; an ethylene glycol series such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, or diethylene glycol dimethyl ether; glycol ether acetates such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate such as propylene glycol monomethyl ether acetate or dipropylene glycol monoethyl ether acetate; an amide such as N-methylpyrrolidone, dimethyl formamide, or dimethyl acetamide; a ketone such as methyl ethyl ketone (MEK), methyl isobutyl ketone (MIBK), or cyclohexanone; a petroleum product such as toluene, xylene, or solvent naphtha; an ester such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

The composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition, the preparation of the quantum dot-polymer composite, and optionally, the patterning of the composite. Types and examples of the aforementioned additives may include any suitable compound having a desired function and are not particularly limited.

If present, the amount of the additives may be, based on a total weight of the composition (or a total solid content of the composition), greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, but it is not limited thereto.

The composition according to an embodiment may be prepared by a method including: preparing quantum dot dispersion including the aforementioned quantum dots, the dispersing agent, and the solvent; and mixing the quantum dot dispersion with the initiator; the polymerizable monomer (e.g., acryl-based monomer); optionally the thiol compound; optionally the metal oxide fine particle, and optionally the additives. Each component may be mixed sequentially or simultaneously, but a mixing order is not particularly limited.

Other details for the first monomer, the second monomer, and the third monomer, the carboxylic acid group containing binder polymer, the (meth)acrylic monomer, the initiator, the solvent, the polythiol compound, and the additives and preparation of the composition may refer to US-2017-0059988-A1, the entire content of which is incorporated herein by references.

The composition may provide a quantum dot-polymer composite or a quantum dot polymer composite pattern via polymerization (e.g., photopolymerization).

In an embodiment, a quantum dot-polymer composite may include a polymer matrix; and the aforementioned quantum dots dispersed in the polymer matrix.

The polymer matrix may include a crosslinked polymer, a linear polymer having a carboxylic acid group, or a combination thereof. The linear polymer having the carboxylic acid group may be as dispersing agent (e.g., a binder polymer including a carboxylic acid group), the crosslinked polymer may include a polymerization product (e.g., insulating polymer) of a polymerizable monomer including a carbon-carbon double bond (at least one, for example, at least two, at least three, at least four, or at least five), and a polymerization product of the polymerizable monomer and a polythiol compound including at least two thiol groups (e.g., at a terminal end of the polythiol compound), or a combination thereof. The quantum dot polymer composite may further include a metal oxide fine particle(s) dispersed in the polymer matrix.

In an embodiment, the polymer matrix may include a cross-linked polymer and a dispersing agent (e.g., (carboxyl group-contained) binder polymer). The polymer matrix may not include a conjugated polymer (except for a cardo binder). The cross-linked polymer may include a thiolene resin, a cross-linked poly(meth)acrylate, or a combination thereof. In an embodiment, the cross-linked polymer may be a polymerization product of the polymerizable monomer and, optionally, the polythiol compound.

Details of the quantum dots, the dispersing agent, or the binder polymer, the polymerizable monomer, and the polythiol compound are the same as described above.

An amount of the quantum dots (or an amount of the metal oxide fine particle) in the composite may be corresponded to the aforementioned amount range based on a total solid content of the composite. In the composite, an amount of the polymer matrix may be greater than or equal to about 3 wt %, greater than or equal to about 5 wt %, greater than or equal to about 10 wt %, greater than or equal to about 15 wt %, greater than or equal to about 20 wt %, or any combination thereof, based on a total weight of the composite. In the composite, an amount of the polymer matrix may be less than or equal to about 97 wt %, less than or equal to about 95 wt %, less than or equal to about 90 wt %, less than or equal to about 80 wt %, less than or equal to about 70 wt %, or any combination thereof, based on a total weight of the composite.

The film of the quantum dot-polymer composite (or the quantum dot-polymer composite pattern that will be described below) may have, for example, a thickness of less than or equal to about 30 micrometers (μm), for example less than or equal to about 25 μm, less than or equal to about 20 μm, less than or equal to about 15 μm, less than or equal to about 10 μm, less than or equal to about 8 μm, less than or equal to about 7 μm and greater than or equal to about 2 μm, for example, greater than or equal to about 3 μm, greater than or equal to about 3.5 μm, greater than or equal to about 4 μm, greater than or equal to about 5 μm, or greater than or equal to about 6 μm.

In an embodiment, a patterned film includes a repeating section including a first section emitting first light, wherein the first section includes the quantum dot polymer composite.

The repeating section may include a second section emitting second light having a different maximum photoluminescence peak wavelength from that of the first light. The second section may include a quantum dot-polymer composite. The quantum dot-polymer composite of the second section may include a second quantum dot configured to emit the second light. The second quantum dot may include the aforementioned quantum dot. The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section emitting or passing third light (e.g., blue light) different from the first light and the second light. The third light may have a maximum (e.g., photoluminescence) peak wavelength ranging from 380 nm to 480 nm.

In an embodiment, a display device includes a light source and a photoluminescence element, and the photoluminescence element includes a substrate and an emission layer disposed on the substrate, and the emission layer includes a film or patterned film of the quantum dot-polymer composite. The light source is configured to provide the photoluminescence element with incident light. The incident light may have a luminescence peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

Figure 2:
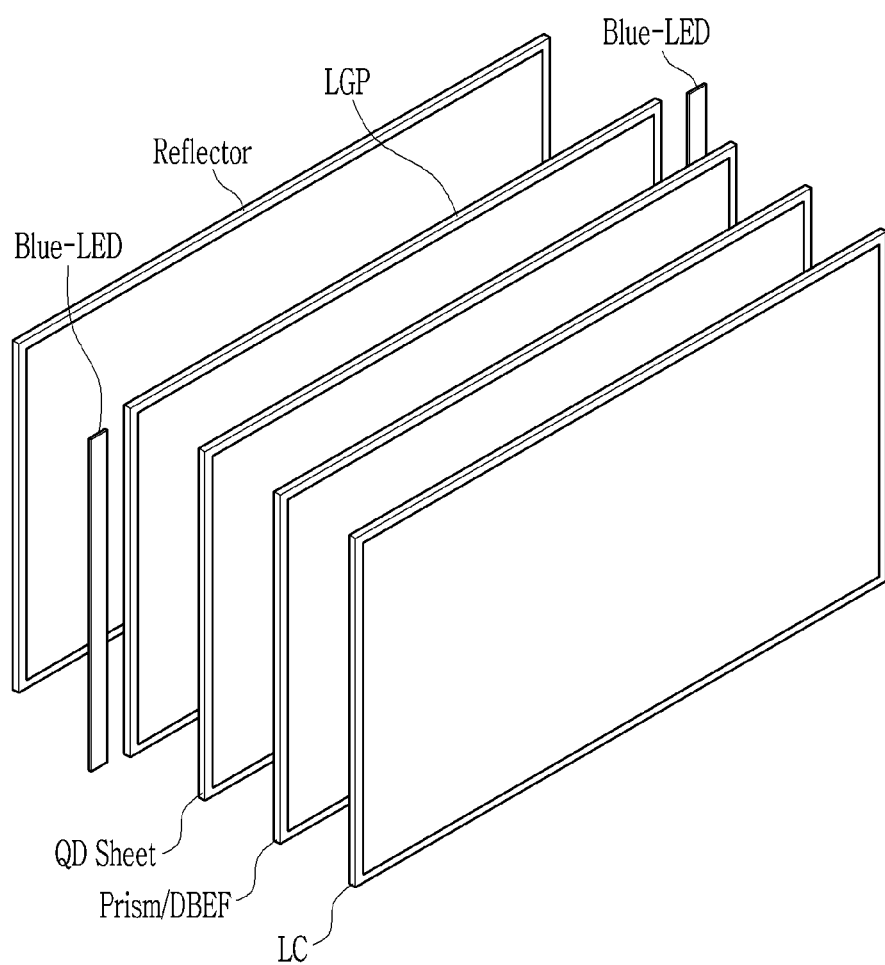
FIG. 2 is an exploded view of a display device according to an embodiment

In an embodiment, the photoluminescence element may include a sheet of the quantum dot polymer composite. The display device may further include a liquid crystal panel and the sheet of the quantum dot polymer composite may be disposed between the light source and the liquid crystal panel. FIG. 2 shows an exploded view of a display device. Referring to FIG. 2, the display device may have a structure wherein a reflector, a light guide panel (LGP) and a blue LED light source (Blue-LED), the quantum dot-polymer composite sheet (QD sheet), and various optical films such as a prism, double brightness enhance film (DBEF), and the like are stacked, and a liquid crystal (LC) panel is disposed thereon.

In an embodiment of a display device, the emission layer includes a pattern of the quantum dot polymer composite of an embodiment. The pattern of the quantum dot-polymer composite may include at least one repeating section configured to emit light of a predetermined wavelength. The pattern of the quantum dot polymer composite may include a first repeating section that may emit a first light, a second repeating section that may emit a second light, or a combination thereof. Preparation of the pattern of the quantum dot polymer composite may be carried out by a photolithography method or an ink-jet method.

The first light and the second light have a different maximum photoluminescence peak wavelength in a photoluminescence spectrum. In an embodiment, the first light may be red light (R) having a maximum photoluminescence peak wavelength of about 600 nm to about 650 nm (e.g., about 620 nm to about 650 nm), the second light may be green light (G) having a maximum photoluminescence peak wavelength of about 500 nm to about 550 nm (e.g., about 510 nm to about 550 nm), or vice versa (i.e., the first light may be a green light and the second light may be a red light).

The pattern of the quantum dot-polymer composite may further include a third section that may emit and/or transmit a third light (e.g., blue light) different from the first and the second lights. A maximum (e.g., photoluminescence) peak wavelength of the third light may be greater than or equal to about 380 nm and less than or equal to about 480 nm.

An optical element (e.g., a excitation light blocking layer or a first optical filter which will be described below) for blocking (e.g., reflecting or absorbing) excitation light (e.g., blue light and/or green light) may be disposed on a front surface (a light-emitting surface) of the first section, the second section, or a combination thereof.

In the display device, the light source may include a plurality of light emitting units corresponding to the first section and the second section, respectively, and the light emitting units may include a first electrode and a second electrode facing each other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device (e.g., the organic light emitting diode (OLED)) may be selected appropriately and are not particularly limited. The light source includes an organic light emitting diode (OLED) emitting blue light (and optionally, green light).

Figure 3B:
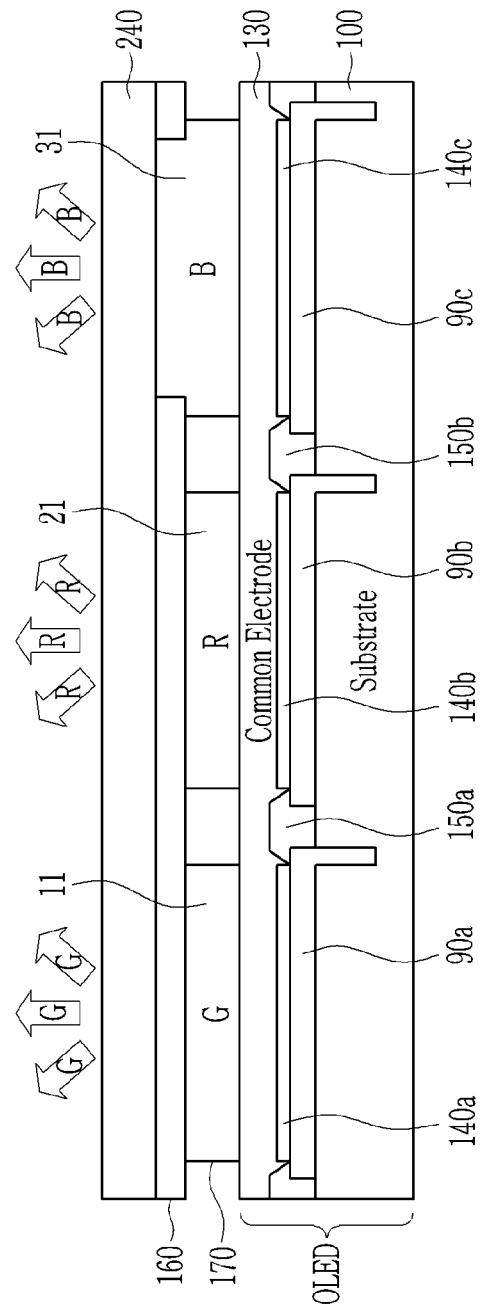
FIG. 3B is a cross-sectional view of a device according to an embodiment.

FIGS. 3A and 3B are schematic cross-sectional views of display devices according to embodiments. Referring to FIGS. 3A and 3B, a light source includes an organic light emitting diode (OLED) emitting blue light. The blue light of the OLED can be based upon phosphorescent emission, fluorescent emission, or a combination of the two. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED).

The pixel areas of the OLED may be disposed corresponding to the first, second, and third sections that will be described in detail below, respectively.

A stack structure including a quantum dot-polymer composite (e.g., a section including red quantum dot (R) and a section including green quantum dot (G)) pattern and a substrate may be disposed on the light source. The sections are configured so that excitation light (e.g. blue light) emitted from the light source is entered thereinto and red light and green light may be emitted, respectively. Excitation light (e.g., blue light or green light) emitted from the light source may pass through the third section.

The light (e.g., blue and/or green light) emitted from the light source may enter the second section 21 and the first section 11 of the quantum dot-polymer composite pattern 170 to emit (e.g., converted) red light R and green light G, respectively. The excitation light (B) emitted from the light source passes through or transmits from the third section 31. Over the second section emitting red light, the first section emitting green light, or a combination thereof, an optical element 160 may be disposed. The optical element may be an excitation light (blue) cut layer which cuts (e.g., reflects or absorbs) blue light and optionally green light, or a first optical filter layer 310 (see FIG. 4). The excitation light (e.g. blue and/or optionally green) cut layer 160 may be disposed on the upper substrate 240. The excitation light cut layer 160 may be disposed between the upper substrate 240 and the quantum dot-polymer composite pattern and over the first section 11 and the second section 21. Details of the excitation light (blue) cut layer are the same as set forth for the first optical filter 310 below.

The display device may be obtained by separately fabricating the stack structure and (e.g., blue light emitting) LED or OLED and then assembling the same. Alternatively, the device may be obtained by forming a quantum dot polymer composite pattern of an embodiment on the LED or OLED.

The substrate may be a substrate including an insulating material. The substrate may include glass; various polymers such as a polyester (e.g., polyethylene terephthalate (PET) polyethylene naphthalate (PEN), a polymethacrylate, or a polyacrylate); a polycarbonate; a polysiloxane (e.g., polydimethylsiloxane (PDMS)); an inorganic material such as $Al_2O_3$ or ZnO; or a combination thereof, but is not limited thereto. A thickness of the substrate may be selected appropriately considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor, or the like is formed on the substrate. The wire layer may further include a gate line, a sustain voltage line, a gate insulating layer, a data line, a source electrode, a drain electrode, a semiconductor, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described below.

The pixel electrode may function as an anode of the display device. The pixel electrode may be formed of a transparent conductive material such as indium tin oxide (ITO) or indium zinc oxide (IZO). The pixel electrode may be formed of a material having a light-blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure where the transparent conductive material and the material having light-blocking properties are stacked sequentially.

Between two adjacent pixel electrodes, a pixel define layer (PDL) may overlap with a terminal end of the pixel electrode to divide the pixel electrode into a pixel unit. The pixel define layer is an insulation layer which may electrically block the at least two pixel electrodes.

The pixel define layer covers a part of the upper surface of the pixel electrode, and the remaining region of the pixel electrode where is not covered by the pixel define layer may provide an opening. An organic emission layer that will be described below may be formed in the region defined by the opening.

The organic emission layer defines each pixel area by the pixel electrode and the pixel define layer. In other words, one pixel area may be defined as an area where is formed with one organic emission unit layer which is contacted with one pixel electrode divided by the pixel define layer.

For example, in the display device according to an embodiment, the organic emission layer may be defined as a first pixel area, a second pixel area and a third pixel area, and each pixel area is spaced apart from each other leaving a predetermined interval by the pixel define layer.

In an embodiment of a display device, the organic emission layer may emit a third light belong to visible light region or belong to UV region. That is, each of the first to the third pixel areas of the organic emission layer may emit a third light. In an embodiment, the third light may be a light having the highest energy in the visible light region, for example, may be blue light and/or green light. When all pixel areas of the organic emission layer are designed to emit the same light, each pixel area of the organic emission layer may be all formed of the same or similar materials or materials that may show the same or similar properties. Thus, it may significantly relieve a process difficulty of forming the organic emission layer, so the display device may be easily applied for the large scale/large area process. However, the organic emission layer according to an embodiment is not necessarily limited thereto, but the organic emission layer may be designed to emit at least two different lights.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stack structure and the lower substrate, and in the stack structure, the organic emission layer may be disposed to face the liquid crystal layer. The display device may further include a polarizer between the liquid crystal layer and the organic emission layer. The light source may further include LED and if desired, a light guide panel.

Figure 4:
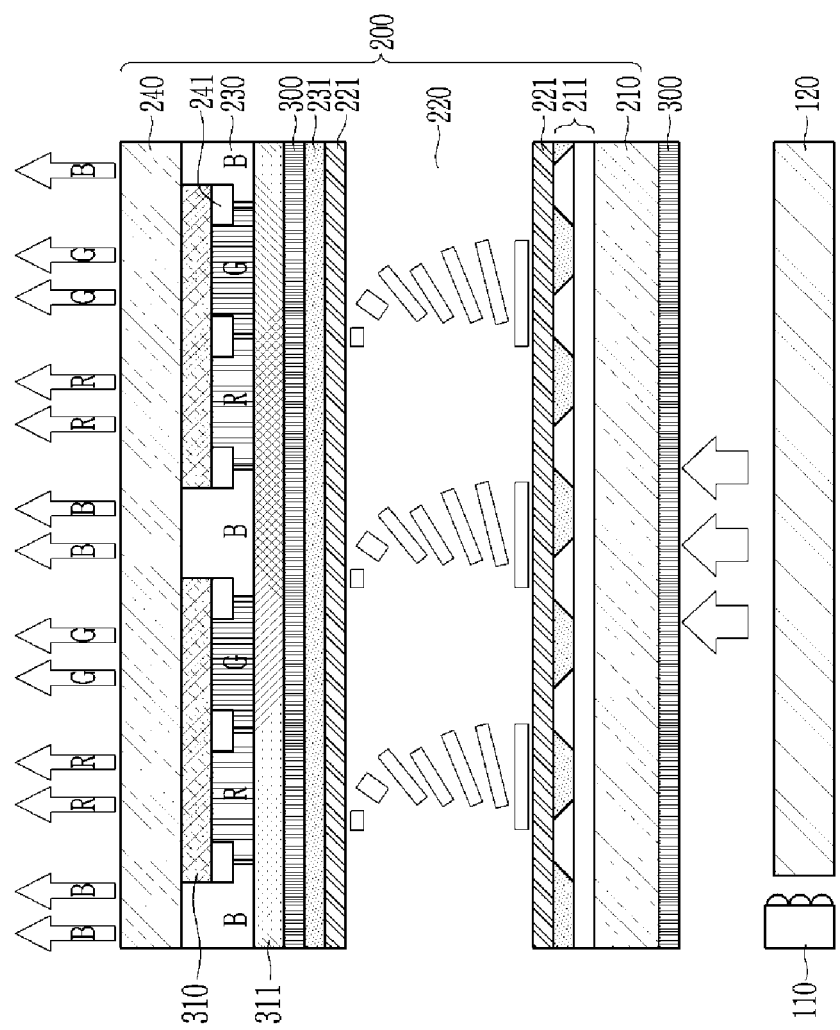
FIG. 4 is a cross-sectional view of a device according to an embodiment.

Non-limiting examples of the display device (e.g., a liquid crystal display device) according to an embodiment are illustrated with a reference to a drawing. FIG. 4 is a schematic cross sectional view showing a liquid crystal display according to an embodiment. The display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stack structure, and a liquid crystal layer 220 disposed between the stack structure and the lower substrate. The stack structure includes a transparent substrate (or an upper substrate) 240 and a photoluminescent layer 230 including a pattern including a quantum dot-polymer composite.

The lower substrate 210 (also referred to as an array substrate) may be a transparent insulating material substrate. The substrate is the same as described above. A wire plate 211 is provided on an upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 is provided under the lower substrate. Materials and structures of the polarizer 300 are known and are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer may be disposed between the liquid crystal layer 220 and the photoluminescence layer 230. The polarizer may be any polarizer that used in a liquid crystal display device. The polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light or white light. The light source may include a blue (or green) LED, a (white) LED, a (white) OLED, or a combination thereof, but is not limited thereto. The backlight unit may further include a light guide panel 120. In an embodiment, the backlight unit may be an edge-type lighting. For example, the backlight unit may include a reflector, a light guide panel provided on the reflector and providing a planar light source with the liquid crystal panel 200, at least one optical sheet on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector, and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are known and are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. If needed, the photoluminescent layer may further include at least one fourth section. The fourth section may include a quantum dot that emits different color from light emitted from the first to third sections (e.g., cyan, magenta, and yellow light).

In the photoluminescence layer 230, sections forming a pattern may be repeated corresponding to pixel areas formed on the lower substrate. A transparent common electrode 231 may be provided on the photoluminescent layer 230 (e.g., photoluminescent color filter layer).

The third section (B) configured to emit and/or transmit excitation light or a portion thereof (e.g., blue light) may be a transparent color filter that does not change a light emitting spectrum of the light source. In this case, blue light emitted from the backlight unit may enter in a polarized state and may be emitted through the polarizer and the liquid crystal layer as it is. If needed, the third section may include a quantum dot emitting blue light.

If desired, the display device may further include an excitation light (blue, green, or a combination thereof) blocking layer (cut filter) or a first optical filter layer. The excitation light blocking layer may be disposed between bottom surfaces of the first section (R), the second section (G), and optionally the third section (B) and the upper substrate 240 or on a top surface of the upper substrate 240. The excitation (blue) light blocking layer may include a sheet having openings that correspond to a pixel area showing a blue color (e.g., third section). In an embodiment, the excitation light may further include green light together with blue light and the third section (e.g., blue pixel) may further include a green light cut filter. The excitation light blocking layer may be formed on portions corresponding to the first and second sections and optionally the third section. The first optical filter layer may be integrally formed as one body structure at the portions except portions overlapped with the third section, but is not limited thereto. At least two (e.g., three) first optical filter layers may be spaced apart and be disposed on each of the positions overlapped with the first and the second sections and optionally the third section.

In an embodiment, the first optical filter layer may block light having a portion of a wavelength region in the visible light region. The first optical filter layer may transmit light having other (visible light) wavelength regions. For example, the first optical filter layer may block blue light (or green light) and transmit light except blue (or green) light. For example, the first optical filter layer may transmit green light, red light, and/or or yellow light that is mixed light thereof. The first optical filter layer may transmit blue light and block the green light and may be disposed on the blue light emitting pixel.

In an embodiment, the first optical filter layer may substantially block blue light having a wavelength of less than or equal to about 500 nm. The first optical filter layer may transmit light in another visible light wavelength region of greater than or equal to about 500 nm and less than or equal to about 700 nm.

In an embodiment, the first optical filter layer may have light transmittance of greater than or equal to about 70%, greater than or equal to about 80%, greater than or equal to about 90%, or even about 100% with respect to a visible light of a desired wavelength range (e.g., that may be selected from about 500 nm to about 700 nm).

The first optical filter layer may include a polymer thin film including a dye, a pigment, or a combination thereof that absorbs light having a wavelength to be blocked. The first optical filter layer may block at least 80%, or at least 90%, even at least 95% of excitation light (e.g., having a wavelength of less than or equal to about 480 nm) and it may have light transmittance of greater than or equal to about 70%, greater than or equal to about 80%, greater than or equal to about 90%, or even about 100% with respect to a visible light of a desired wavelength range (e.g., selected from greater than or equal to about 500 nm and less than or equal to about 700 nm).

The first optical filter layer may block (e.g., absorb) and substantially block excitation light or a portion thereof (e.g., blue light having a wavelength of less than or equal to about 500 nm or green light or a combination thereof) and for example may selectively transmit light of a desired wavelength (e.g., green light or red light or optionally blue light). In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. A first optical filter layer selectively transmitting blue light may be disposed on the portion overlapped with the section emitting blue light.

In an embodiment, the first optical filter layer may include at least one of a first region and a second region wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. When the excitation light includes green light, a first optical filter layer blocking (or absorbing) green light may be disposed on the blue light emitting section.

The first region and the second region may be optically isolated. The first optical filter (layer) may contribute to improving color purity of a display device.

The first optical filter layer may be a reflective filter including a plurality of layers (e.g., inorganic material layers) with different refractive index. For example, two layers having different refractive index may be alternately stacked with each other, or for example a layer having a high refractive index and a layer having a low refractive index may be alternately stacked with each other.

As refractive index different between the layer having a high refractive index and the layer having a low refractive index is higher, the first optical filter layer having higher wavelength selectivity may be provided. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, from about 3 nm to about 10,000 nm, about 300 nm to about 10,000 nm, or about 1,000 nm to about 10,000 nm. The high refractive index layers may have the same thickness, the same material, or a combination thereof as one another or a different thickness, a different material, or a combination thereof from each other. The low refractive index layers may have the same thickness, the same material, or a combination thereof as one another or a different thickness, a different material, or a combination thereof from each other.

The display device may further include a second optical filter layer 311 (e.g., a red/green or yellow light recycling layer) disposed between the photoluminescence layer and the liquid crystal layer (e.g., between a photoluminescence layer and an upper polarizer) and transmitting at least a part of the third light and reflecting at least a part of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated single layer having an approximately planar surface.

In an embodiment, the second optical filter layer may include a monolayer having a low refractive index, for example, it may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, it may be formed by alternatively stacking two layers having different refractive indexes, or for example, it may be formed by alternatively stacking material having a high refractive index and material having a low refractive index.

The layer having a high refractive index in the second optical filter layer may include, for example, at least one of hafnium oxide, tantalum oxide, titanium oxide, zirconium oxide, magnesium oxide, cesium oxide, lanthanum oxide, indium oxide, niobium oxide, aluminum oxide, and silicon nitride, but according to embodiments, it may include a variety of materials having a higher refractive index than the layer having a low refractive index.

The layer having a low refractive index in the second optical filter layer may include, for example, a silicon oxide, but according to embodiments, it may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacked number thereof may be determined depending upon a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least one part of the first light (R) and the second light (G) and transmits at least a portion (e.g., entire) of the third light (B). For example, the second optical filter layer may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Thus, the reflected green light and red light may pass through the first and the second sections to be emitted to the outside of the display device.

The second optical filter layer may reflect a wavelength region of greater than about 500 nm in greater than or equal to about 70%, greater than or equal to about 80%, or greater than or equal to about 90%, or even about 100%.

Meanwhile, the second optical filter layer may have a transmittance to a light of a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or even about 100%.

In an embodiment, the stack structure may be produced by a method using the photoresist composition. The method may include forming a film of the composition on a substrate;

exposing a selected region of the film to light (e.g., a wavelength of less than or equal to about 400 nm); and developing the exposed film with an alkali developing solution to obtain a pattern including the quantum dot-polymer composite.

Figure 5:
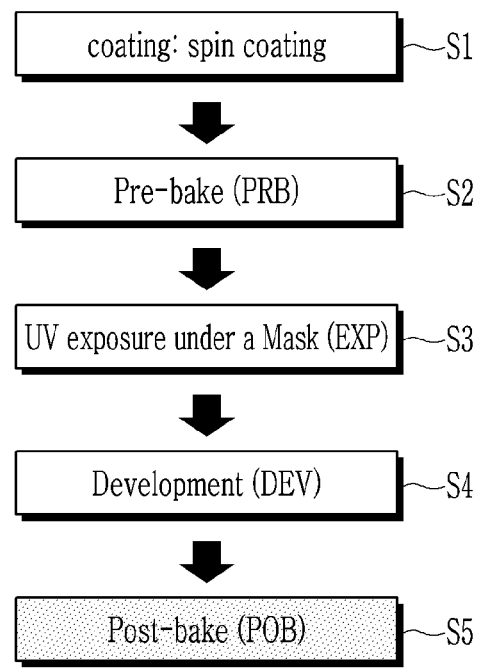
FIG. 5 shows a process of producing a quantum dot-polymer composite pattern using a composition according to an embodiment.
Figure 5:
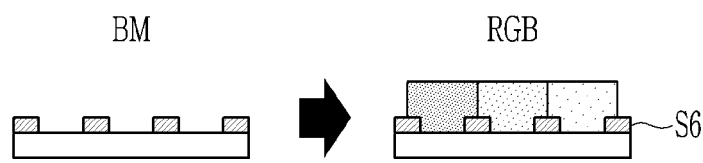

The substrate and the composition have the same specification as described above. Non-limiting methods of forming the pattern are illustrated, referring to FIG. 5.

The composition is coated to have a predetermined thickness on a substrate in an appropriate method of spin coating, slit coating, and the like (S1). The formed film may be, optionally, pre-baked (PRB) (S2). The pre-baking may be performed by selecting an appropriate condition from known conditions of a temperature, time, an atmosphere, and the like.

The formed (or optionally pre-baked) film is exposed to light having a predetermined wavelength under a mask having a predetermined pattern (S3). A wavelength and intensity of the light may be selected considering types and amounts of the photoinitiator, types, and amounts of the quantum dots, and the like.

The exposed film is treated with an alkali developing solution (e.g., dipping or spraying) to dissolve an unexposed region and obtain a desired pattern (S4). The obtained pattern may be, optionally, post-baked (POB) to improve crack resistance and solvent resistance of the pattern, for example, at about 150° C. to about 230° C. for a predetermined time (e.g., greater than or equal to about 10 minutes or greater than or equal to about 20 minutes) (S5). The quantum dot polymer composite including the quantum dot of an embodiment may exhibit a excitation light conversion rate of greater than about 29%, for example, greater than or equal to about 30%, or greater than or equal to about 31%.

In an embodiment where the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and an appropriate number of times (e.g., twice or more or three times or more) repeating a formation of the above pattern about each composition (S6). For example, the quantum dot-polymer composite may have, e.g., be provided in, a pattern including at least two repeating color sections (e.g., RGB sections). The quantum dot-polymer composite pattern may be used as a photoluminescence-type color filter in a display device.

In an embodiment, the stack structure may be produced using an ink composition. The method may include depositing the same (e.g., to provide a desirable pattern) on the desirable substrate using an appropriate system (e.g., droplet discharging device such as inkjet or nozzle printing device) and heating the same to remove a solvent and to perform a polymerization. The method may provide a highly precise quantum dot-polymer composite film or pattern in a simple and rapid way.

An embodiment provides an electronic device including the quantum dot. The device may include a light emitting diode (LED), an organic light emitting diode (OLED), a sensor, a solar cell, an imaging sensor, or a liquid crystal display (LCD), but is not limited thereto Hereinafter, additional embodiments are illustrated in more detail with reference to the following Examples. As noted, the Examples represent exemplary embodiments of the present invention, and the present invention is not limited thereto.

EXAMPLES

Analysis Methods
1. Ultraviolet (UV)-Visible (Vis) Absorption Analysis
UV-Vis spectroscopy analysis is conducted using a Shimadzu UV2700 spectrometer and to obtain UV-Visible absorption spectra.
2. Photoluminescence Analysis
Photoluminescence Analysis is conducted using a PL QY spectrometer, Otsuka QE-2100 (purchased from OTSUKA Electronics Co., Ltd.) and to obtain photoluminescence spectra. Photoluminescence spectra of the produced nanocrystals are obtained at an irradiation wavelength of 450 nm.
3. ICP Analysis
Inductively coupled plasma-atomic emission spectroscopy (ICP-AES) analysis is conducted using a Shimadzu ICPS-8100.
4. Brightness and Luminous Efficiency of Quantum Dot Polymer Composite
Luminous efficiency with blue excitation light (B) excitation is measured with an integrating sphere using a method well known to those of skill. A QD polymer composite is positioned in the integrating sphere and is irradiated with the blue excitation light. The amount of green (or red) light (A) emitted from the irradiated composite, and the amount of blue light (B') passing through the composite, are each measured.

Blue light absorption rate and quantum efficiency of the quantum dot polymer composite are obtained according to the following formulae:

Blue light absorption rate=$(B-B')/B \times 100\%$

Blue light conversion rate=$A/B \times 100\%$

B: Intensity of blue excitation light (# of photons)
A: Intensity of green (or red) light emitted from composite during the blue light excitation
B': Intensity of blue excitation light having passed through (or not absorbed) by the composite Reference Example 1: InZnP Cores are Prepared in the Following Manner Indium acetate, zinc acetate, and palmitic acid are dissolved in 1-octadecene in a 200 milliliter (mL) reaction flask, and the mixture is heated at 120° C. under vacuum for one hour. A molar ratio of indium, zinc, to palmitic acid is 1:1:3 is added to the reaction flask. After the one hour, nitrogen is slowly introduced into the reaction flask to about 1 atm, the reaction flask is heated to 260° C., and then a mixed solution of tris(trimethylsilyl)phosphine ($TMS_3P$) and trioctylphosphine (TOP) is quickly injected. The amount of the $TMS_3P$ is about 0.75 moles per one mole of indium. The reaction mixture is maintained at 260° C. for about 20 minutes. The reaction mixture is then rapidly cooled to room temperature and acetone is added to the reaction mixture to facilitate the precipitation of nanocrystals, which are then separated by centrifugation, and dispersed in toluene to obtain a toluene dispersion of InZnP core nanocrystals. The average particle size of the InZnP core is about 2 nanometers (nm).

Example 1

[1] Synthesis of Quantum Dots and Characterization Thereof
(1) Selenium and Sulfur are Dispersed in Trioctylphosphine (TOP) to Obtain a 2 Molar (M) Se/TOP Stock Solution and a 2M S/TOP Stock Solution, Respectively.

In a 200 mL reaction flask, zinc acetate and oleic acid are dissolved in trioctylamine and the solution is heated at 120° C. under vacuum for 10 minutes. After the 10 minutes, nitrogen is slowly added to the reaction flask to about I atm, and the resulting solution is heated to about 320° C. A toluene dispersion of the InZnP semiconductor nanocrystal core prepared in Reference Example 1 is injected into the reaction flask, and several predetermined amounts of Se/TOP stock solution is injected into the reaction flask over time. A reaction is carried out to obtain a reaction mixture that includes nanoparticles having a ZnSe shell disposed on the InZnP core. A total of reaction time is 100 minutes and a total amount of Se (about 20 moles) is used per one mole of the indium.

Thereafter, with the reaction mixture maintained at 320° C., a 2M S/TOP stock solution is injected slowly to the reaction mixture over a reaction time to obtain a resulting solution including particles having a ZnS shell disposed on the ZnSe shell. A total of reaction time is 40 minutes and a total amount of the S (about 12 moles) is used per one mole of the indium.

An excess amount of ethanol is added to the final reaction mixture to facilitate the precipitation of InZnP/ZnSe/ZnS semiconductor nanocrystals, which are then centrifuged. After centrifugation, the supernatant is discarded, and the nanocrystals as separated are dried and dispersed in chloroform or toluene to obtain a quantum dot solution (hereinafter, QD solution). An ICP-AES analysis of the QD solution is conducted and the results are shown in Table 1. A UV-vis absorption spectroscopic analysis and a photoluminescence spectroscopic analysis are also conducted on the QD solution, and the results are shown in Table 1.

[2] Production of a Quantum Dot Polymer Composite and a Pattern Thereof.

(1) Preparation of Quantum Dot-Binder Dispersion

A chloroform solution of the quantum dots prepared above is mixed with a solution of a binder polymer, which is a copolymer of methacrylic acid, benzyl methacrylate, hydroxyethyl methacrylate, and styrene, (acid value: 130 milligrams (mg) of KOH per gram (mg KOH/g), molecular weight: 8,000 grams per mole (g/mol), methacrylic acid: benzyl methacrylate:hydroxyethyl methacrylate:styrene (molar ratio)=61.5:12:16.3:10.2. Propylene glycol monomethyl ether acetate, PGMEA, is used as a solvent to provide a 30 percent by weight (wt %) quantum dot-binder dispersion.

(2) Preparation of a Photosensitive Composition

To the quantum dot-binder dispersion prepared above, a hexaacrylate having the structure below (as a photopolymerizable monomer), ethylene glycol di-3-mercaptopropionate (hereinafter, 2T, as a multi-thiol compound), an oxime ester compound (as a photoinitiator), $TiO_2$ as metal oxide fine particles, and PGMEA (as a solvent) are added to obtain a composition.

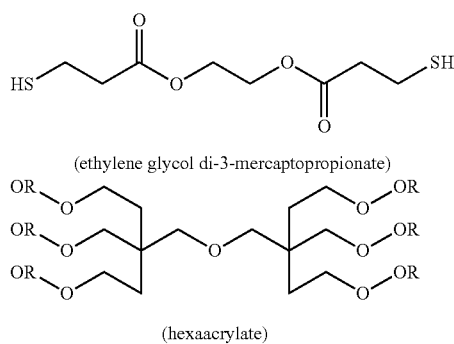

wherein

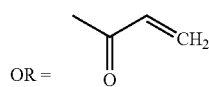

Based on a total solid content, the prepared composition includes 40 wt % of quantum dots, 12.5 wt % of the binder polymer, 25 wt % of 2T, 12 wt % of the photopolymerizable monomer, 0.5 wt % of the photoinitiator, and 10 wt % of the $TiO_2$ fine particles. The total solid content is about 25 wt %.

(3) Formation of Quantum Dot-Polymer Composite Pattern and Heat Treatment

The composition obtained above is spin-coated on a glass substrate at 150 revolutions per minute (rpm) for 5 seconds (s) to provide a film. The obtained film is pre-baked at 100° C. (PRB). The pre-baked film is exposed to light (wavelength: 365 nm, intensity: 100 millijoules, mJ) under a mask having a predetermined pattern (e.g., a square dot or stripe pattern) for a 1 second. The film is developed with a potassium hydroxide aqueous solution (concentration: 0.043 weight percent) for 50 seconds to obtain a pattern of a quantum dot polymer composite with a thickness of 6 micrometers (μm).

The obtained pattern is heat-treated at a temperature of 180° C. for 30 minutes under a nitrogen atmosphere (POB). For the obtained film pattern (QD Ex. 1), a photoluminescent peak wavelength, blue light absorption rate, and a photoconversion efficiency are measured and the results are shown in Table 2.

Example 2

1. A core-shell quantum dot of Example 2 is prepared in the same manner as set forth in Example 1, with the exception that 1 mole of indium per 18 moles of the Se is used. For the obtained QD solutions, an ICP-AES analysis, an UV-vis absorption spectroscopic analysis and a photoluminescence spectroscopic analysis are measured and the results are shown in Table 1.

2. A quantum dot polymer composite (QD Ex. 2) is prepared in the same manner as set forth in Example 1 except for using the quantum dots as obtained in Example 2. For the obtained film pattern, blue light absorption rate, and a photoconversion efficiency are measured and the results are shown in Table 2.

Comparative Example 1

1. An InZnP/ZnSe/ZnS quantum dot is prepared in the same manner as set forth in Example 1 with the exception that 1 mole of indium per 7 moles of Se used.

For the obtained QD solutions, an ICP-AES analysis, an UV-vis absorption spectroscopic analysis and a photoluminescence spectroscopic analysis are conducted, and the results are shown in Table 1.

2. A quantum dot polymer composite (QD Comp. Ex. 1) is prepared in the same manner as set forth in Example 1 except for using the quantum dots as obtained in comparative example 1. For the obtained film pattern, blue light absorption rate, and a photoconversion efficiency are measured and the results are shown in Table 2.

Comparative Example 2

1. An InZnP/ZnSe/ZnS quantum dot is prepared in the same manner as set forth in Example 1, except that the ZnS coating is prepared by using a quick injection manner, i.e., wherein the S/TOP stock solution is injected into the reaction flask in a single portion (e.g., within a minute) (i.e., is provided by quick-injection), rather than in several distinct portions over the course of several tens of minutes as in Example 1.

For the obtained QD solutions, an ICP-AES analysis, an UV-vis absorption spectroscopic analysis and a photoluminescence spectroscopic analysis are conducted, and the results are shown in Table 1.

2. A quantum dot polymer composite (QD Comp. Ex. 2) is prepared in the same manner as set forth in Example 1 except for using the quantum dots as obtained in comparative example 2. For the obtained film pattern, blue light absorption, and a photoconversion efficiency are measured and the results are shown in Table 2.

TABLE 1

|  |  | Ex. 1 | Ex. 2 | Comp. Ex. 2 | Comp. Ex. 3 |
|---|---|---|---|---|---|
| Absorption value ratio at 450 nm/ 1$^{st}$ peak, $A_{450}/A_{first}$ |  | 0.76 | 0.85 | 0.54 | 0.66 |
| Quantum Yield |  | 93% | 91% | 82% | 83% |
| 1$^{st}$ peak wavelength (nm) |  | 497 | 501 | 502 | 492 |
| Lowest point of valley (nm) |  | 464 | 467 | 466 | 459 |
| Luminescent wavelength for film (nm) |  | 535 | 535 | 547 | 533 |
| VD |  | 0.53 | 0.58 | 0.52 | about 0.4 |
| ZnSe (ML) |  | 1.74 | 1.70 | 0.98 | about 1 |
| ZnS (nm) |  | 0.37 | 0.41 | 0.64 | 0.57 |
| ICP | Se + S/In | 31 | 31 | 19 | 19 |
|  | S/Se | 0.55 | 0.63 | 1.71 | 1.375 |
|  | Zn/In | 39 | 37 | 24 | 25 |

TABLE 2

|  | Blue light CE (%) | Process maintenance ratio | Absorption rate (%) |
|---|---|---|---|
| QD Example 1 | 32.1 | 97.9% | 88 |
| QD Example 2 | 33.0 | 98.2% | 89 |
| QD Comp. Ex. 1 | 28.1 | 93% | 89 |
| QD Comp. Ex. 2 | 28.0 | 94% | 84 |

The results and data reported in Table 2 confirm that the quantum dot polymer composites (QD Ex. 1 and QD Ex. 2) including the quantum dots of Examples 1 to 2, respectively, exhibit enhanced optical properties and stability (process maintenance ratio) in comparison with the quantum dot polymer composites (QD Comp. Ex. 1 and QD Ex. Comp 2) including the quantum dots of Comparative Examples 1 and 2, respectively.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. Quantum dots each comprising
a semiconductor nanocrystal core comprising indium, phosphorous, and optionally zinc,
a semiconductor nanocrystal shell disposed on the semiconductor nanocrystal core, the semiconductor nanocrystal shell comprising zinc, selenium, and sulfur,
wherein the quantum dots are configured to exhibit a maximum photoluminescence peak in a green light wavelength region, and in an ultraviolet-visible absorption spectrum of the quantum dots, a ratio $A_{450}/A_{first}$ of an absorption value at 450 nanometers to an absorption value of a first absorption peak is greater than or equal to about 0.7, and a valley depth (VD) defined by the following equation is greater than or equal to about 0.4:

$$(Abs_{first}-Abs_{valley})/Abs_{first}=VD$$

wherein, $Abs_{first}$ is the absorption value of the first absorption peak wavelength, and $Abs_{valley}$ is an absorption value at a lowest point of the valley adjacent to the first absorption peak, and
wherein the maximum photoluminescence peak of the quantum dots has a full width at half maximum of less than or equal to 40 nanometers.

2. The quantum dots of claim 1, wherein the first absorption peak is in a wavelength range of greater than about 450 nanometers and less than or equal to 510 nanometers.

3. The quantum dots of claim 1, wherein the ratio of the absorption value at 450 nanometers to the absorption value at the first absorption peak is greater than or equal to about 0.78.

4. The quantum dots of claim 1, wherein the valley depth is from about 0.5 to 0.58.

5. The quantum dots of claim 1, wherein the valley depth is greater than or equal to about 0.53.

6. The quantum dots of claim 1, wherein the quantum dots do not comprise cadmium, and
the quantum dots comprises a mole ratio of sulfur with respect to selenium (S:Se) of less than or equal to about 2.5:1.

7. The quantum dots of claim 1, wherein the quantum dots comprises a mole ratio of sulfur with respect to selenium (S:Se) is greater than or equal to about 0.05:1 and less than or equal to about 0.8:1.

8. The quantum dots of claim 1, wherein in the quantum dots,
a mole ratio of zinc with respect to indium is greater than or equal to about 10:1 and less than or equal to about 50:1; or
a mole ratio of a sum of selenium and sulfur with respect to indium [(S+Se)/In] is greater than or equal to about 10:1 and less than or equal to about 40:1.

9. The quantum dot of claim 1, wherein a quantum efficiency of the quantum dots is greater than or equal to about 80%.

10. The quantum dot of claim 1, wherein a quantum efficiency of the quantum dots is greater than or equal to about 90%.

11. Quantum dots each comprising
a semiconductor nanocrystal core comprising indium, phosphorous, and optionally zinc,
a semiconductor nanocrystal shell disposed on the semiconductor nanocrystal core, the semiconductor nanocrystal shell comprising zinc, selenium, and sulfur,
wherein the quantum dots are configured to exhibit a maximum photoluminescence peak in a green light wavelength region, and in an ultraviolet-visible absorption spectrum of the quantum dots, a ratio $A_{450}/A_{first}$ of an absorption value at 450 nanometers to an absorption value of a first absorption peak is greater than or equal to about 0.7, and a valley depth (VD) defined by the following equation is greater than or equal to about 0.4:

$$(Abs_{first}-Abs_{valley})/Abs_{first}=VD$$

wherein, $Abs_{first}$ is the absorption value of the first absorption peak wavelength, and $Abs_{valley}$ is an absorption value at a lowest point of the valley adjacent to the first absorption peak, and
wherein in an ultraviolet-visible absorption spectrum of the quantum dots the first absorption peak is in a wavelength range of less than or equal to 510 nanometers.

12. The quantum dots of claim 11, wherein the maximum photoluminescence peak of the quantum dots has a full width at half maximum of less than or equal to 40 nanometers.

13. The quantum dots of claim 11, wherein the ratio of the absorption value at 450 nanometers to the absorption value at the first absorption peak is greater than or equal to about 0.78.

14. The quantum dots of claim 11, wherein the valley depth is greater than about 0.5 and less than or equal to 0.58.

15. The quantum dots of claim 11, wherein the valley depth is greater than or equal to about 0.53.

16. The quantum dots of claim 11, wherein the quantum dots do not comprise cadmium, and
the quantum dots comprises a mole ratio of sulfur with respect to selenium (S:Se) of less than or equal to about 2.5:1.

17. The quantum dots of claim 11, wherein the quantum dots comprises a mole ratio of sulfur with respect to selenium (S:Se) is greater than or equal to about 0.05:1 and less than or equal to about 0.8:1.

18. A display device, comprising
a light source and a light emitting element,
wherein the light emitting element comprises a quantum dot-polymer composite with the quantum dots of claim 1, and the light source is configured to provide the element with incident light.

19. The display device of claim 18, wherein the quantum dot polymer composite comprises a first repeating section to emit a first light and a second repeating section to emit a second light, and wherein the second light has a different maximum photoluminescent peak wavelength from a maximum photoluminescent peak wavelength of the first light.

20. A display device, comprising
a light source and a light emitting element,
wherein the light emitting element comprises a quantum dot-polymer composite with the quantum dots of claim 11, and the light source is configured to provide the light emitting element with incident light.

21. The display device of claim 20, wherein the quantum dot polymer composite comprises a first repeating section to emit a first light and a second repeating section to emit a second light, and wherein the second light has a different maximum photoluminescent peak wavelength from a maximum photoluminescent peak wavelength of the first light.

\* \* \* \* \*